United States Patent
Owada et al.

(10) Patent No.: US 10,276,727 B2
(45) Date of Patent: Apr. 30, 2019

(54) MEMORY CELL, SEMICONDUCTOR INTEGRATED CIRCUIT DEVICE, AND METHOD FOR MANUFACTURING SEMICONDUCTOR INTEGRATED CIRCUIT DEVICE

(71) Applicant: FLOADIA CORPORATION, Kodaira-shi, Tokyo (JP)

(72) Inventors: Fukuo Owada, Kodaira (JP); Yasuhiko Kawashima, Kodaira (JP); Shinji Yoshida, Kodaira (JP); Yasuhiro Taniguchi, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 23 days.

(21) Appl. No.: 15/570,981

(22) PCT Filed: Apr. 26, 2016

(86) PCT No.: PCT/JP2016/063074
§ 371 (c)(1),
(2) Date: Oct. 31, 2017

(87) PCT Pub. No.: WO2016/178392
PCT Pub. Date: Nov. 10, 2016

(65) Prior Publication Data
US 2018/0308990 A1    Oct. 25, 2018

(30) Foreign Application Priority Data
May 1, 2015    (JP) ................ 2015-094287

(51) Int. Cl.
*H01L 29/792*    (2006.01)
*G11C 16/04*    (2006.01)
(Continued)

(52) U.S. Cl.
CPC ........ *H01L 29/792* (2013.01); *G11C 16/0425* (2013.01); *H01L 21/28282* (2013.01);
(Continued)

(58) Field of Classification Search
CPC ......... H01L 21/28282; H01L 27/11573; H01L 29/792; H01L 29/42344; H01L 29/66833
(Continued)

(56) References Cited

U.S. PATENT DOCUMENTS

| 2002/0137296 A1 | 9/2002 | Satoh et al. |
| 2011/0095348 A1 | 4/2011 | Chakihara et al. |
| 2011/0233649 A1* | 9/2011 | Shimizu ............ H01L 21/28282 257/324 |

FOREIGN PATENT DOCUMENTS

| CN | 1420543 A | 5/2003 |
| CN | 1481015 A | 3/2004 |

(Continued)

OTHER PUBLICATIONS

Chinese Office action issued in Patent Application No. 201680023931.0 dated Jul. 25, 2018.
(Continued)

*Primary Examiner* — Tan N Tran
(74) *Attorney, Agent, or Firm* — Pearne & Gordon LLP

(57) ABSTRACT

A semiconductor integrated circuit device includes first and second select gate electrodes that are sidewall-shaped along sidewalls of a memory gate structure. With this configuration, the memory gate structure is not disposed on the first select gate electrode and the second select gate electrode. Accordingly, the memory gate structure the first select gate structure, and the second select gate structure can have equal heights, thereby achieving reduction in size as compared to a conventional case. In addition, a silicide layer on the first select gate electrode and a silicide layer on the second select (Continued)

gate electrode can be separated farther from a memory gate electrode by the thickness of a cap film. Accordingly, the silicide layers on the first select gate electrode and the second select gate electrode are unlikely to contact with the memory gate electrode, thereby preventing a short-circuit defect of the memory gate electrode.

12 Claims, 15 Drawing Sheets

(51) Int. Cl.
   *H01L 21/28* (2006.01)
   *H01L 29/423* (2006.01)
   *H01L 29/66* (2006.01)
   *H01L 27/11573* (2017.01)

(52) U.S. Cl.
   CPC .. *H01L 27/11573* (2013.01); *H01L 29/42344* (2013.01); *H01L 29/66833* (2013.01); *G11C 16/0466* (2013.01)

(58) Field of Classification Search
   USPC .......................................... 257/311, 315, 324
   See application file for complete search history.

(56) References Cited

FOREIGN PATENT DOCUMENTS

| | | |
|---|---|---|
| JP | 2002-289715 A | 10/2002 |
| JP | 2004-266203 A | 9/2004 |
| JP | 2005-142354 A | 6/2005 |
| JP | 2011-103401 A | 5/2011 |
| JP | 2011-129816 A | 6/2011 |
| JP | 2011-222938 A | 11/2011 |

OTHER PUBLICATIONS

English Translation of Chinese Office action issued in Patent Application No. 201680023931.0 dated Jul. 25, 2018.
Extended European Search Report issued in Patent Application No. EP 16 78 9528 dated Jul. 31, 2018.
International Search Report issued in Patent Application No. PCT/JP2016/063074 dated Jul. 12, 2016.
Written Opinion issued in Patent Application No. PCT/JP2016/063074 dated Jul. 12, 2016.

\* cited by examiner

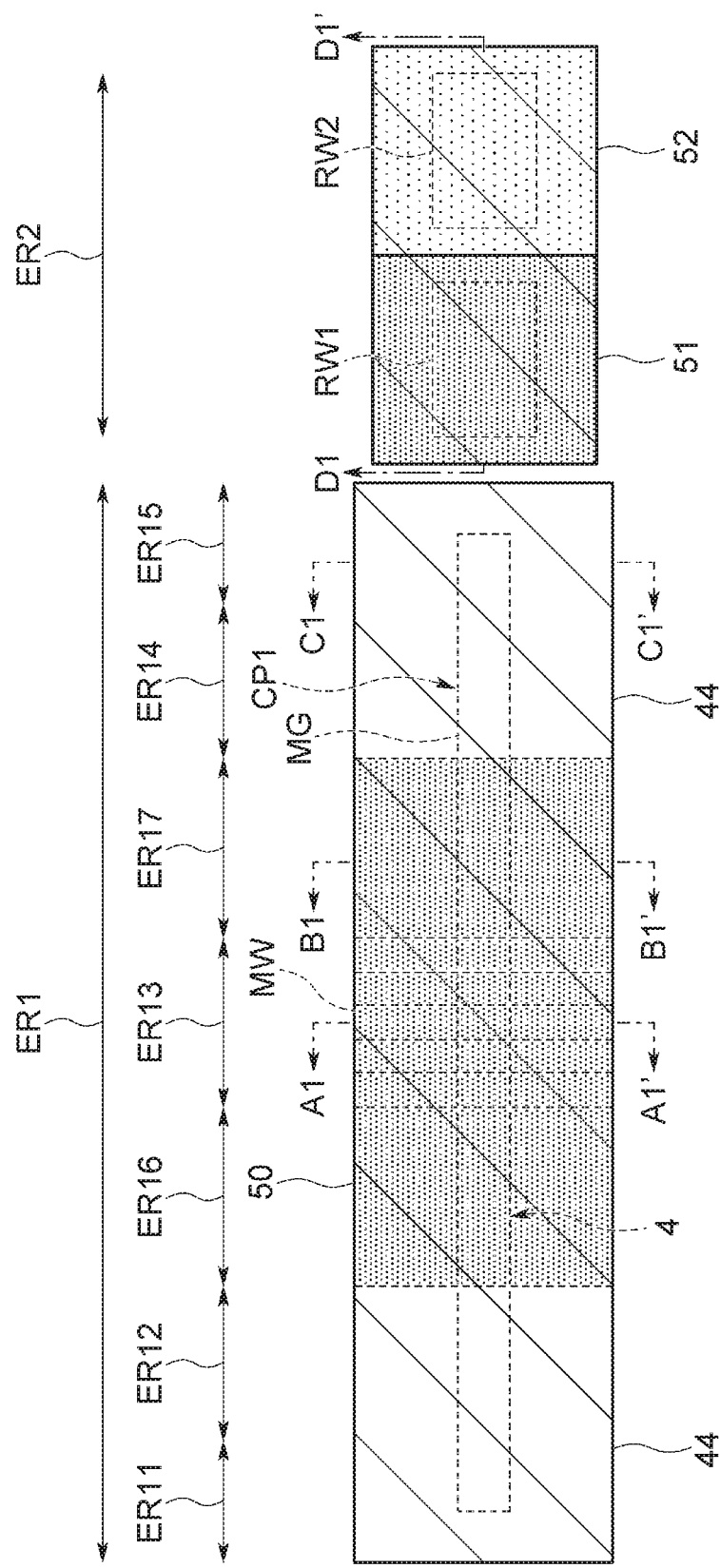

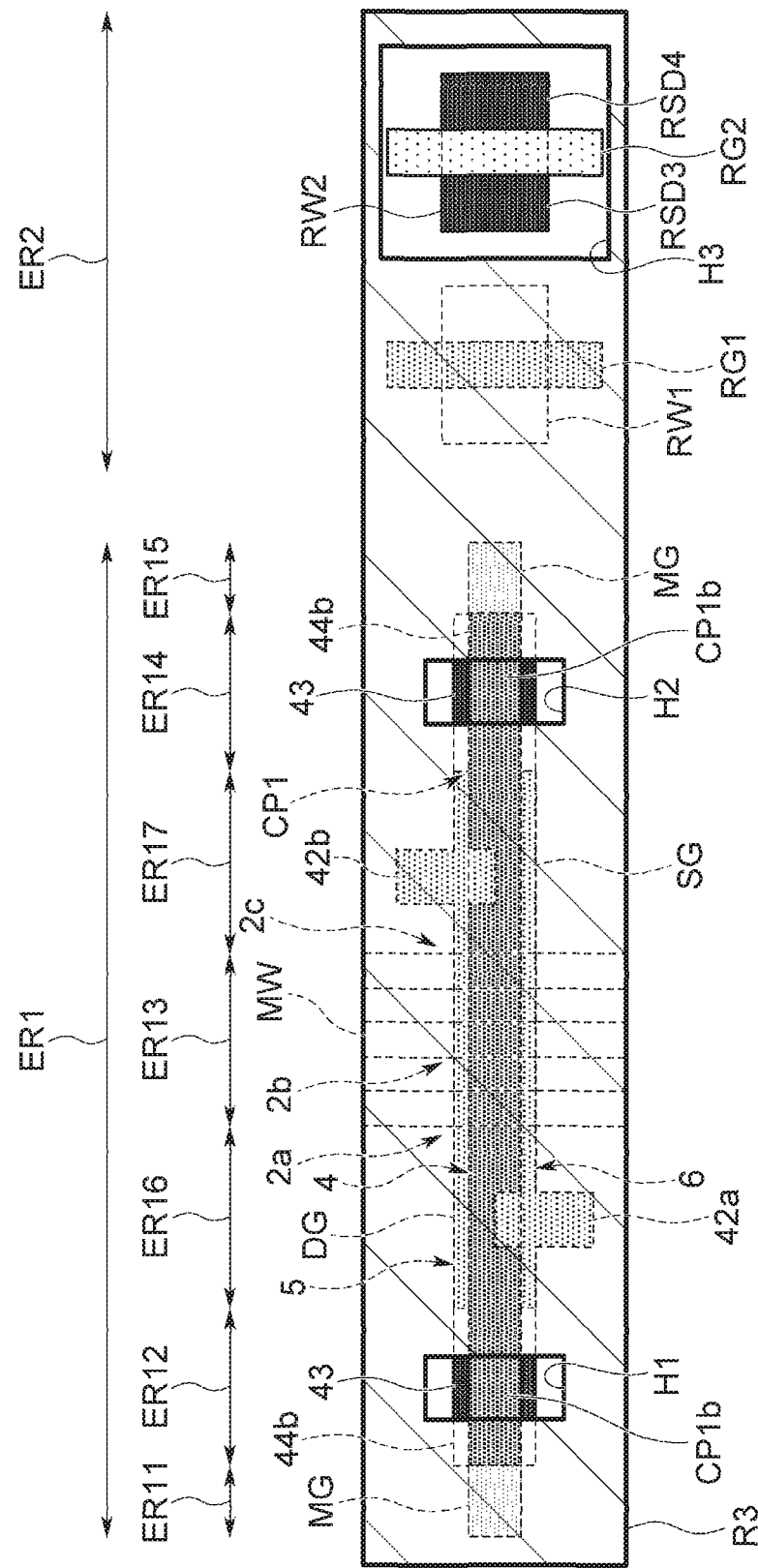

MEMORY CELL, SEMICONDUCTOR INTEGRATED CIRCUIT DEVICE, AND METHOD FOR MANUFACTURING SEMICONDUCTOR INTEGRATED CIRCUIT DEVICE

TECHNICAL FIELD

The present invention relates to a memory cell, a semiconductor integrated circuit device, and a method for manufacturing a semiconductor integrated circuit device.

BACKGROUND ART

Japanese Patent Laid-open No. 2011-129816 (Patent Literature 1) discloses a conventional memory cell (refer to FIG. 15 in Patent Literature 1) in which a memory gate structure is disposed between two select gate structures. This memory cell includes a drain region connected with a bit line, a source region connected with a source line, and a first select gate structure, a memory gate structure, and a second select gate structure sequentially disposed on the memory well between the drain and source regions. In the memory cell with this configuration, the memory gate structure is provided with a charge storage layer. Data is programmed by injecting charge into the charge storage layer, and erased by removing charge from the charge storage layer.

In such a memory cell, when charge is injected into the charge storage layer, the second select gate structure connected with the source line blocks voltage application, whereas a low bit voltage from the bit line is applied to a channel layer below the memory gate structure through the first select gate structure. In this case, a high memory gate voltage is applied to a memory gate electrode of the memory gate structure, and charge is injected into the charge storage layer by a quantum tunneling effect due to a voltage difference between the bit voltage and the memory gate voltage.

CITATION LIST

Patent Literature

Patent Literature 1: Japanese Patent Laid-open No. 2011-129816

SUMMARY OF INVENTION

Technical Problem

However, in the conventional memory cell disclosed in Patent Literature 1, the memory gate structure between the layer-shaped select gate structures is disposed on the select gate structures (refer to FIG. 15 in Patent Literature 1), and thus protrudes upward as compared to the select gate structures on both sides, which prevents reduction in size.

In such a memory cell, silicide layers are disposed on a select gate electrode of each select gate structure and on a memory gate electrode of the memory gate structure. When size reduction is achieved such that the silicide layers on the select gate electrodes are positioned close to the silicide layer on the adjacent memory gate electrode, any variation in products through a manufacturing process potentially leads to a short-circuit defect due to short circuit between the select gate structure and the memory gate structure through the silicide layers.

The present invention has been made under such circumstances and aims at providing a memory cell, a semiconductor integrated circuit device, and a method for manufacturing a semiconductor integrated circuit device that can prevent a short-circuit defect at a memory gate electrode while achieving reduction in size as compared to a conventional case.

Solution to Problem

In order to solve the above-described problems, a memory cell according to the present invention includes: a drain region disposed on a memory well surface and connected with a bit line; a source region disposed on the memory well surface and connected with a source line; a memory gate structure disposed between the drain region and the source region and including a lower memory gate insulating film, a charge storage layer, an upper memory gate insulating film, a memory gate electrode, and a cap film made of an insulating material stacked in this order over the memory well; a first select gate structure including a first select gate electrode disposed over the memory well between the drain region and the memory gate structure through a first select gate insulating film, the first select gate structure being adjacent to a first sidewall of the memory gate structure through a first sidewall spacer; and a second select gate structure including a second select gate electrode disposed over the memory well between the source region and the memory gate structure through a second select gate insulating film, the second select gate structure being adjacent to a second sidewall of the memory gate structure through a second sidewall spacer. The first select gate electrode has a sidewall shape from the first sidewall spacer and is provided with a silicide layer on an upper surface portion of the first select gate electrode. The second select gate electrode has a sidewall shape from the second sidewall spacer and is provided with a silicide layer on an upper surface portion of the second select gate electrode.

A semiconductor integrated circuit device according to the present invention includes memory cells each connected with a bit line and a source line and disposed in a matrix of rows and columns. The memory cells are each the memory cell according to claim 1 or 2. A peripheral circuit region including a peripheral circuit is provided around a memory circuit region including the memory cells.

A method for manufacturing a semiconductor integrated circuit device according to the present invention is a method for manufacturing a semiconductor integrated circuit device including: a memory circuit region in which a memory cell including a first select gate structure, a second select gate structure, and a memory gate structure is disposed, the first select gate structure including a silicide layer on a first select gate electrode, the second select gate structure including a silicide layer on a second select gate electrode, and the memory gate structure being disposed between the first select gate structure and the second select gate structure through a sidewall spacer; and a peripheral circuit region in which a logic gate structure of a peripheral circuit is disposed. The method includes: an electrode layer formation step of providing the memory gate structure including a lower gate insulating film, a charge storage layer, an upper gate insulating film, a memory gate electrode, and a cap film made of an insulating material stacked in this order on a memory well, across the memory circuit region from a memory cell region to a memory gate contact region, forming the sidewall spacer on each of facing sidewalls of the memory gate structure, and then forming a layer-shaped select gate electrode formation layer in the memory cell region and a layer-shaped logic gate electrode formation layer in the peripheral circuit region; a logic gate electrode formation step of reducing a thickness of the cap film in the memory gate contact region to be smaller than the thickness of the cap film in the memory cell region by partially removing a surface of the cap film of the memory gate structure disposed in the memory gate contact region while covering the select gate electrode formation layer in the memory cell region with a resist patterned by a photomask, and forming a logic gate electrode of the logic gate structure by patterning the logic gate electrode formation layer in the peripheral circuit region by using the resist; and a select gate electrode formation step of forming the first select gate electrode sidewall-shaped along one of the sidewall spacers and the second select gate electrode electrically insulated from the first select gate electrode and sidewall-shaped along the other sidewall spacer by etching back the select gate electrode formation layer in the memory cell region while covering the peripheral circuit region with a resist patterned by using a photomask, and of removing the cap film in the memory cell region and the memory gate contact region while the thickness of the cap film in the memory gate contact region is smaller than the thickness of the cap film in the memory cell region. In the select gate electrode formation step, the cap film remains in the memory cell region, and the cap film in the memory gate contact region is removed to expose the memory gate electrode in the memory gate contact region.

A method for manufacturing a semiconductor integrated circuit device according to the present invention is a method for manufacturing a semiconductor integrated circuit device including: a memory circuit region in which a memory cell including a first select gate structure, a second select gate structure, and a memory gate structure is disposed, the first select gate structure including a silicide layer on a first select gate electrode, the second select gate structure including a silicide layer on a second select gate electrode, and the memory gate structure being disposed between the first select gate structure and the second select gate structure through a sidewall spacer; and a peripheral circuit region in which a logic gate structure of a peripheral circuit is disposed. The method includes: an electrode layer formation step of providing the memory gate structure including a lower gate insulating film, a charge storage layer, an upper gate insulating film, a memory gate electrode, and a cap film made of an insulating material stacked in this order on a memory well, across the memory circuit region from a memory cell region to a memory gate contact region, forming the sidewall spacer on each of facing sidewalls of the memory gate structure, and then, forming a layer-shaped select gate electrode formation layer in the memory cell region and a layer-shaped logic gate electrode formation layer in the peripheral circuit region; a select gate electrode formation step of forming the first select gate electrode sidewall-shaped along one of the sidewall spacers and the second select gate electrode electrically insulated from the first select gate electrode and sidewall-shaped along the other sidewall spacer by etching back the select gate electrode formation layer in the memory cell region while covering the peripheral circuit region with a resist patterned by a photomask, and of reducing a thickness of the cap film by partially removing a surface of the cap film in the memory circuit region; and a logic gate electrode formation step of forming a logic gate electrode of the logic gate structure by removing the cap film in the memory gate contact region while covering the memory cell region with a resist patterned by a photomask and by patterning the logic gate electrode formation layer in the peripheral circuit region by using the resist. In the logic gate electrode formation step, the cap film in the memory gate contact region is removed to expose the memory gate electrode in the memory gate contact region while the cap film is left in the memory cell region.

Advantageous Effects of Invention

In a memory cell, a semiconductor integrated circuit device, a method for manufacturing a semiconductor integrated circuit device according to the present invention, a first select gate electrode and a second select gate electrode are sidewall-shaped along sidewalls of a memory gate structure. With this configuration, the memory gate structure is not disposed on the first select gate electrode and the second select gate electrode. Thus, the memory gate structure, the first select gate structure, and the second select gate structure can have equal heights. Accordingly, the memory gate structure does not protrude from the first select gate electrode and the second select gate electrode, thereby achieving reduction in the size of the memory cell as compared to a conventional case.

In the memory cell, the semiconductor integrated circuit device, and the method for manufacturing a semiconductor integrated circuit device according to the present invention, a cap film having a predetermined thickness is provided on the memory gate electrode. Thus, a silicide layer on the first select gate electrode and a silicide layer on the second select gate electrode can be separated farther from the memory gate electrode by the thickness of the cap film. Accordingly, the silicide layers on the first select gate electrode and the second select gate electrode are unlikely to contact with the memory gate electrode, thereby preventing a short-circuit defect of the memory gate electrode of the memory cell.

BRIEF DESCRIPTION OF DRAWINGS

FIG. 3 is a schematic view illustrating manufacturing process (1) for a semiconductor integrated circuit device.

FIG. 9 is a schematic view illustrating manufacturing process (4) for a semiconductor integrated circuit device.

DESCRIPTION OF EMBODIMENTS

Figure 1:
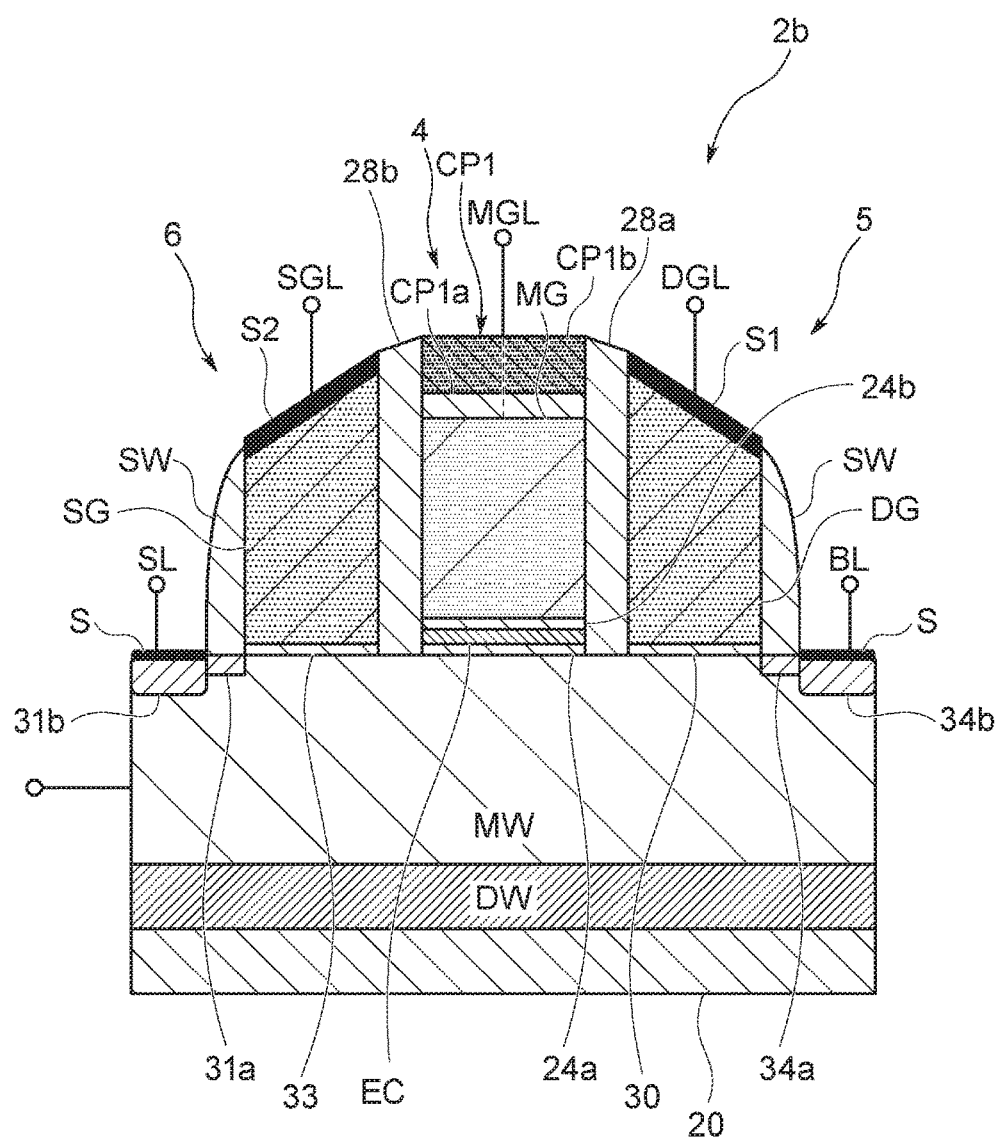
FIG. 1 is a schematic view illustrating a sectional configuration of a memory cell according to the present invention.

Hereinafter, embodiments of the present invention will be described in the following order.
1. Configuration of memory cell
1-1. Data programming method
1-1-1. First programming method
1-1-2. Second programming method
1-1-3. Other operations
2. Planar layout of semiconductor integrated circuit device
3. Method for manufacturing semiconductor integrated circuit device
4. Operations and effects
5. Method for manufacturing semiconductor integrated circuit device according to other embodiments
6. Other embodiments (1) Configuration of Memory Cell In FIG. 1, reference numeral 2b denotes a memory cell according to the present invention. In the memory cell 2b, a P-type memory well MW is disposed over a substrate 20 containing P-type Si or the like, through an N-type deep well layer DW. A memory gate structure 4, first select gate structure 5, and a second select gate structure 6 are disposed over the memory well MW. The memory gate structure 4 is included in an N-type transistor structure. The first select gate structure 5 is included in an N-type metal-oxide-semiconductor (MOS) transistor structure. The second select gate structure 6 is included in an N-type MOS transistor structure.

A drain region 34b and a source region 31b are spaced at a distance on the surface of the memory well MW. The drain region 34b is disposed at one end of the first select gate structure 5. The source region 31b is disposed at one end of the second select gate structure 6. The drain region 34b is connected with a bit line BL, and the source region 31b is connected with a source line SL. A low-concentration drain region 34a is disposed adjacent to the drain region 34b on the surface of the memory well MW. A sidewall structure SW disposed along a sidewall of the first select gate structure 5 is disposed on the low-concentration drain region 34a. A low-concentration source region 31a is disposed adjacent to the source region 31b on the surface of the memory well MW. A sidewall structure SW disposed along a sidewall of the second select gate structure 6 is disposed on the low-concentration source region 31a.

In this embodiment, impurity concentration is $1.0E21/cm^3$ or more in each of the low-concentration drain region 34a and the low-concentration source region 31a. In the memory well MW, impurity concentration is $1.0E19/cm^3$ or less, preferably $3.0E18/cm^3$ or less in a surface region (for example, a region extending to a depth of 50 nm from the surface) in which a channel layer is formed.

The memory gate structure 4 includes a charge storage layer EC over the memory well MW between the low-concentration drain region 34a and the low-concentration source region 31a through a lower gate insulating film 24a made of an insulating material such as $SiO_2$. The charge storage layer EC is made of, for example, silicon nitride ($Si_3N_4$), silicon oxynitride (SiON), alumina ($Al_2O_3$), or hafnia (HfO2). The memory gate structure 4 also includes a memory gate electrode MG over the charge storage layer EC through an upper gate insulating film 24b made of an insulating material such as $SiO_2$. In the memory gate structure 4 with this configuration, the lower gate insulating film 24a and the upper gate insulating film 24b insulate the charge storage layer EC from the memory well MW and the memory gate electrode MG.

In addition, the memory gate structure 4 includes a cap film CP1 made of an insulating material and disposed on the memory gate electrode MG. A silicide layer S1 on an upper surface of the first select gate structure 5, and a silicide layer S2 on an upper surface of the second select gate structure 6 are separated farther from an upper surface of the memory gate electrode MG by the thickness of the cap film CP1. The memory gate electrode MG in a region in which the memory cell 2b is formed in this manner is provided with no silicide layer on the upper surface thereof but is covered by the cap film CP1.

In this case, the cap film CP1 preferably has a thickness of 10 nm or larger, preferably 30 nm or larger. The silicide layer Si of the first select gate structure 5 and the silicide layer S2 of the second select gate structure 6 can be each separated farther from the memory gate electrode MG by the thickness of the cap film CP1. In this embodiment, the cap film CP1 has a stacked structure including a lower cap film CP1a made of an insulating material such as $SiO_2$, and an upper cap film CP1b made of an insulating material such as SiN, which is different from that of the lower cap film CP1a. The upper cap film CP1b is stacked on the lower cap film CP1a. In this case, the upper cap film CP1b is made of an insulating material having a high etching selectivity with the lower cap film CP1a.

The memory gate structure 4 is provided with, along a first sidewall thereof, the sidewall spacer 28a made of an insulating material, and is adjacent to the first select gate structure 5 through the sidewall spacer 28a. The sidewall spacer 28a, which is disposed between the memory gate structure 4 and the first select gate structure 5, has a thickness enough to insulate the memory gate structure 4 and the first select gate structure 5.

When the width between the memory gate structure 4 and the first select gate structure 5 is less than 5 nm, application of voltage to the memory gate electrode MG and a first select gate electrode DG potentially causes breakdown voltage to the sidewall spacer 28a. When the width between the memory gate structure 4 and the first select gate structure 5 exceeds 40 nm, however, resistance increase occurs in the memory well MW between the memory gate electrode MG and the first select gate electrode DG. As a result, no readout current is likely to occur between the memory gate structure 4 and the first select gate structure 5 at data reading. For this reason, in the present embodiment, the sidewall spacer 28a between the memory gate structure 4 and the first select gate structure 5 desirably has a width between 5 nm and 40 nm inclusive.

The first select gate structure 5 includes, on the memory well MW between the sidewall spacer 28a and the drain region 34b, a first select gate insulating film 30 made of an insulating material and having a thickness of less than or equal to 9 nm, preferably less than or equal to 3 nm. The first select gate electrode DG is disposed on the first select gate insulating film 30. The silicide layer S1 is disposed on an upper surface of the first select gate electrode DG and connected with a first select gate line DGL.

The memory gate structure 4 is provided with a sidewall spacer 28b made of an insulating material on a second sidewall thereof, and is adjacent to the second select gate structure 6 through the sidewall spacer 28b. The sidewall spacer 28b, which is disposed between the memory gate structure 4 and the second select gate structure 6, has a thickness equal to that of the first sidewall spacer 28a to insulate the memory gate structure 4 and the second select gate structure 6.

When the distance between the memory gate structure 4 and the second select gate structure 6 is less than 5 nm, application of voltage to the memory gate electrode MG and a second select gate electrode SG potentially causes breakdown voltage to the sidewall spacer 28b. When the distance between the memory gate structure 4 and the second select gate structure 6 exceeds 40 nm, however, resistance increase occurs in the memory well MW between the memory gate electrode MG and the second select gate electrode SG. As a result, no readout current is likely to occur between the memory gate structure 4 and the second select gate structure 6 at data reading. For this reason, in the present embodiment, the sidewall spacer 28b between the memory gate structure 4 and the second select gate structure 6 desirably has a width between 5 nm and 40 nm inclusive.

The second select gate structure 6 includes, on the memory well MW between the sidewall spacer 28b and the source region 31b, a second select gate insulating film 33 made of an insulating material and having a thickness of less than or equal to 9 nm, preferably less than or equal to 3 nm. The second select gate electrode SG is disposed on the second select gate insulating film 33. The silicide layer S2 is disposed on an upper surface of the second select gate electrode SG and connected with a second select gate line SGL.

In this embodiment, the first select gate electrode DG and the second select gate electrode SG, which are disposed along sidewalls of the memory gate electrode MG through the sidewall spacers 28a and 28b, each have a sidewall shape in which the height of the first select gate electrode DG or the second select gate electrode SG decreases with the distance from the memory gate electrode MG such that the top portion of the first select gate electrode DG or the second select gate electrode SG slopes down toward the memory well MW.

The first select gate structure 5 and the second select gate structure 6 of the memory cell 2b are sidewall-shaped on the sidewalls of the memory gate structure 4. Although the first select gate structure 5 and the second select gate structure 6 are disposed close to the memory gate structure 4, the silicide layer Si on the first select gate electrode DG and the silicide layer S2 on the second select gate electrode SG are separated farther from the memory gate electrode MG by the cap film CP1 disposed on the memory gate electrode MG, accordingly preventing short circuit between the memory gate electrode MG and the silicide layers S1 and S2.

(1-1) Data Programming Method

A data programming operation on the memory cell 2b having such a configuration is performed by any one of a first programming method or a second programming method. In the first programming method, before execution of a data programming operation, carriers for forming a channel layer are removed from a region (hereinafter referred to as a channel layer formation carrier region) in which the carriers are present in the memory well MW facing the memory gate electrode MG (hereinafter, this operation is referred to as a carrier removing operation). In the second programming method, the data programming operation is executed without the carrier removing operation.

(1-1-1) First Programming Method

For example, in the first programming method, when the carrier removing operation is executed, for example, a first select gate voltage of 1.5 V is applied to the first select gate electrode DG of the first select gate structure 5 through the first select gate line DGL, and a bit voltage of 0 V is applied to the drain region 34b through the bit line BL. Accordingly, the surface of the memory well MW facing the first select gate electrode DG of the first select gate structure 5 becomes a conductive state to electrically connect the drain region 34b connected with the bit line BL and the channel layer formation carrier region of the memory well MW facing the memory gate structure 4.

In the present embodiment, for example, a second select gate voltage of 1.5 V is applied to the second select gate electrode SG of the second select gate structure 6 through the second select gate line SGL, and a source voltage of 0 V is applied to the source region 31b through the source line SL. Accordingly, the surface of the memory well MW facing the second select gate electrode SG of the second select gate structure 6 becomes a conductive state to electrically connect the source region 31b connected with the source line SL and the channel layer formation carrier region of the memory well MW facing the memory gate structure 4.

In addition, in the memory cell 2b, for example, a substrate voltage of 0 V same as the bit voltage and the source voltage is applied to the memory well MW, and a carrier removal voltage of −2 V is applied to the memory gate electrode MG of the memory gate structure 4 through the memory gate line MGL. The carrier removal voltage applied to the memory gate electrode MG is determined with respect to a threshold voltage (Vth) at which the channel layer is formed in the memory well MW facing the memory gate structure 4. The carrier removal voltage is a value out of the range of the threshold voltage (Vth), which differs between a data programming state and a data erasing state, and is a value at which no channel layer is formed when applied to the memory gate electrode MG.

With this configuration, in the memory cell 2b, the carrier removal voltage applied to the memory gate electrode MG expels, from the channel layer formation carrier region, carriers (electrons in this case) induced in the channel layer formation carrier region by conducting the carriers from the channel layer formation carrier region to the drain region 34b and/or the source region 31b.

When the memory cell 2b is in a depleted state with application of, to the memory gate electrode MG, the carrier removal voltage lower than a lower threshold voltage when no electrons are stored in the charge storage layer EC (holes are stored), carriers induced in the channel layer formation carrier region of the memory well MW directly below the memory gate structure 4 can be removed from the channel layer formation carrier region, thereby forming a depleted layer while no channel layer is formed.

Thereafter, a charge storage gate voltage of 12 V is applied to the memory gate electrode MG of the memory gate structure 4 through the memory gate line MGL to inject charge into the charge storage layer EC of the memory cell 2b. Simultaneously, a gate off voltage of 0 V is applied to the second select gate electrode SG of the second select gate structure 6 through the second select gate line SGL, and a source off voltage of 0 V is applied to the source region 31b through the source line SL. This voltage application blocks electrical connection between the source region 31b, which is connected with the source line SL, and the channel layer formation carrier region below the memory gate structure 4. Accordingly, voltage is prevented from being applied to the channel layer formation carrier region below the memory gate structure 4 through the source line SL.

The first select gate voltage of 1.5 V is applied to the first select gate electrode DG of the first select gate structure 5 through the first select gate line DGL, and a charge storage bit voltage of 0 V is applied to the drain region 34b through the bit line BL. This voltage application achieves electrical connection between the drain region 34b, which is connected with the bit line BL, and the channel layer formation carrier region below the memory gate structure 4. Simultaneously, the substrate voltage of 0 V same as the charge storage bit voltage is applied to the memory well MW.

In the memory gate structure 4, carriers are induced in the channel layer formation carrier region through the electrical connection between the channel layer formation carrier region of the memory well MW and the drain region 34b. These carriers form the channel layer having 0 V same as the charge storage bit voltage in the surface of the memory well MW. As a result, in the memory gate structure 4, a large voltage difference of 12 V is generated between the memory gate electrode MG and the channel layer to inject charge into the charge storage layer EC by a quantum tunneling effect caused accordingly, thereby achieving a data programmed state.

To avoid charge injection into the charge storage layer EC of the memory cell 2b when a high charge storage gate voltage is applied to the memory gate electrode MG, a high bit voltage does not need to be applied to the bit line BL in accordance with the high charge storage gate voltage unlike a conventional case. In such a case, the first select gate structure 5 blocks the electrical connection between the bit line BL and the channel layer formation carrier region of the memory well MW directly below the memory gate structure 4, and the second select gate structure 6 blocks the electrical connection between the source line SL and the channel layer formation carrier region directly below the memory gate structure 4. In this manner, charge is prevented from being injected into the charge storage layer EC of the memory gate structure 4.

When no data is to be programmed to the memory cell 2b, for example, the first select gate voltage of 1.5 V is applied to the first select gate electrode DG through the first select gate line DGL, and an off voltage of 1.5 V is applied to the drain region 34b through the bit line BL. Accordingly, the first select gate structure 5 becomes a non-conductive state (off state). As a result, the electrical connection between the drain region 34b, which is connected with the bit line BL, and the channel layer formation carrier region of the memory well MW directly below the memory gate structure 4 is blocked.

In the memory cell 2b to which no data is to be programmed, for example, the gate off voltage of 0 V is applied to the second select gate electrode SG through the second select gate line SGL, and the source off voltage of 0 V is applied to the source region 31b through the source line SL. Accordingly, the second select gate structure 6 becomes a non-conductive state (off state). As a result, the electrical connection between the source region 31b, which is connected with the source line SL, and the channel layer formation carrier region of the memory well MW directly below the memory gate structure 4 is blocked. The substrate voltage of 0 V same as the charge storage bit voltage is applied to the memory well MW.

In this case, carrier is removed in advance from the channel layer formation carrier region below the memory gate structure 4 of the memory cell 2b through the carrier removing operation. While the memory gate structure 4 is in this state, the memory well MW is in a non-conductive state directly below the first select gate structure 5 and the second select gate structure 6, thereby forming a depleted layer in which no charge exists in the memory well MW directly below the memory gate structure 4.

With this configuration, in the memory cell 2b to which no data is to be programmed, voltage decrease occurs through the three layers of the upper gate insulating film 24b, the charge storage layer EC, and the lower gate insulating film 24a. Accordingly, a voltage difference is generated between the memory gate electrode MG and the surface of the memory well MW. In addition, voltage decreases through the depleted layer formed to a predetermined depth from the surface of the memory well MW, and finally reaches 0 V at the substrate.

In the present embodiment, in the memory gate structure 4 of the memory cell 2b, when the charge storage gate voltage of 12 V is applied to the memory gate electrode MG, the voltage difference between the memory gate electrode MG and the surface of the memory well MW is 3.5 V approximately (for example, when a flat band voltage Vfb is 0 V, a memory gate voltage Vg is 12 V, the memory well MW has an acceptor concentration Na of $2.0E17$ $cm^{-3}$, the upper gate insulating film 24b has a thickness of 2 nm, the charge storage layer EC has a thickness of 12 nm, and the lower gate insulating film has a thickness of 2 nm). The voltage difference is not large enough to cause the quantum tunneling effect between the memory gate electrode MG and the surface of the memory well MW, thereby preventing charge injection into the charge storage layer EC.

In addition, in the memory cell 2b, no impurity diffusion region having a high impurity concentration is formed in a region of the memory well MW between the memory gate structure 4 and the first select gate structure 5. Thus, the depleted layer is reliably formed in the memory well MW between the memory gate structure 4 and the first select gate structure 5. The depleted layer prevents application of potential at the surface of the memory well MW directly below the memory gate structure 4 to the first select gate insulating film 30, thereby preventing insulation breakdown of the first select gate insulating film 30 due to the potential at the surface of the memory well MW.

In addition, no impurity diffusion region having a high impurity concentration is formed in a region of the memory well MW between the memory gate structure 4 and the second select gate structure 6. Thus, the depleted layer is reliably formed in the memory well MW between the memory gate structure 4 and the second select gate structure 6. The depleted layer prevents application of potential at the surface of the memory well MW directly below the memory gate structure 4 to the second select gate insulating film 33, thereby preventing insulation breakdown of the second select gate insulating film 33 due to the potential at the surface of the memory well MW.

In the carrier removing operation described above, for example, the second select gate structure 6 may block the electrical connection between the channel layer formation carrier region and the source region 31b to transfer carrier in the channel layer formation carrier region to the drain region 34b. Alternatively, the first select gate structure 5 may block the electrical connection between the channel layer formation carrier region and the drain region 34b to transfer charge in the channel layer formation carrier region to the source region 31b. In this manner, carriers are removed from the channel layer formation carrier region.

(1-1-2) Second Programming Method

The second programming method is same as "(1-1-1) first programming method" described above except that the carrier removing operation is not performed when data is to be programmed to the memory cell 2b, and thus a description thereof will be omitted. To prevent charge injection into the charge storage layer EC of the memory cell 2b when a high charge storage gate voltage is applied to the memory gate electrode MG, the charge storage gate voltage of 12 V is applied to the memory gate electrode MG through the memory gate line MGL. Thus, the charge storage gate voltage is applied to the memory well MW. Accordingly, a channel layer is formed along the surface of the memory well MW facing the memory gate electrode MG.

In the second select gate structure 6 of the memory cell 2b, for example, the gate off voltage of 0 V is applied to the second select gate electrode SG through the second select gate line SGL, and the source off voltage of 0 V is applied to the source region 31b through the source line SL. Accordingly, the memory well MW facing the second select gate electrode SG is in a non-conductive state, thereby blocking electrical connection between the source region 31b, which is connected with the source line SL, and the channel layer below the memory gate structure 4.

In addition, in the first select gate structure 5 of the memory cell 2b, for example, the first select gate voltage of 1.5 V is applied to the first select gate electrode DG through the first select gate line DGL, and the off voltage of 1.5 V is applied to the drain region 34b through the bit line BL. Accordingly, in the first select gate structure 5, the memory well MW facing the first select gate electrode DG is in a non-conductive state, thereby blocking electrical connection between the drain region 34b, which is connected with the bit line BL, and the channel layer below the memory gate structure 4.

In this case, the memory well MW is in a non-conductive state below the first select gate structure 5 and the second select gate structure 6 on both sides of the memory gate structure 4 of the memory cell 2b. This non-conductive state blocks the electrical connection of the channel layer, which is formed at the surface of the memory well MW by the memory gate electrode MG, with the drain region 34b and the source region 31b. Accordingly, the depleted layer is formed around the channel layer.

A capacitor (gate-insulator capacitor) is achieved by a three-layer configuration of the upper gate insulating film 24b, the charge storage layer EC, and the lower gate insulating film 24a. Another capacitor (depletion-layer capacitor) is achieved by the depleted layer formed in the memory well MW and surrounding the channel layer. The gate-insulator capacitor and the depletion-layer capacitor are connected in series. For example, when the gate-insulator capacitor has a capacitance three times as large as that of the depletion-layer capacitor, the channel layer has a channel potential of 9 V.

Thus, when the charge storage gate voltage of 12 V is applied to the memory gate electrode MG in the memory gate structure 4, the channel layer surrounded by the depleted layer in the memory well MW has a channel potential of 9 V. Accordingly, the memory gate electrode MG and the channel layer have a small voltage difference of 3 V therebetween. As a result, the quantum tunneling effect does not occur, and thus charge is prevented from being injected into the charge storage layer EC.

When the above-described operation is executed in the memory cell 2b, the channel potential at start of the operation potentially varies depending on a charge accumulation state of the memory cell 2b. Thus, it is more desirable to additionally perform, before a data programming operation, an operation to set the channel potential of the memory cell 2b to be equal to the potential of the bit line BL or the source line SL. In this operation, the potential of the bit line BL or the source line SL is set to, for example, 0 V, the potential of the first select gate electrode DG or the second select gate electrode SG is set to, for example, 1.5 V, and the memory gate electrode MG is set to, for example, 1.5 V. In this case, the programming operation may be performed after the gate off voltage of 0 V is set back to the first select gate electrode DG or the second select gate electrode SG following the setting of the channel potential.

(1-1-3) Other Operations

When charge is stored in the charge storage layer EC of the memory gate structure 4 (when data is programmed) at data reading, the memory well MW directly below the memory gate structure 4 is in a non-conductive state so that the electrical connection between the first select gate structure 5 and the second select gate structure 6 is blocked by the memory gate structure 4. Accordingly, in the memory cell 2b, from which data is read, a reading voltage of 1.5 V is maintained intact at the bit line BL connected with the drain region 34b adjacent to the first select gate structure 5.

When no charge is stored in the charge storage layer EC of the memory gate structure 4 (when no data is programmed) at data reading, the memory well MW directly below the memory gate structure 4 is in a conductive state so that the first select gate structure 5 and the second select gate structure 6 are electrically connected through the memory gate structure 4. As a result, the source line SL at 0 V and the bit line BL at 1.5 V are electrically connected through the memory cell 2b. Accordingly, in the memory cell 2b from which data is read, the reading voltage at the bit line BL is applied to the source line SL at 0 V, and thus the reading voltage of 1.5 V applied to the bit line BL decreases. In this manner, in a semiconductor integrated circuit device including a plurality of the memory cells 2b, data on whether charge is stored in the charge storage layer EC of the memory cell 2b can be read by detecting whether the reading voltage at the bit line BL has changed.

In a data erasing operation to remove charge in the charge storage layer EC of the memory cell 2b, a memory gate voltage of −12 V is applied to the memory gate electrode MG through the memory gate line MGL. Accordingly, charge in the charge storage layer EC is removed toward the memory well MW at 0 V, thereby achieving data erasing.

(2) Planar Layout of Semiconductor Integrated Circuit Device

Figure 2:
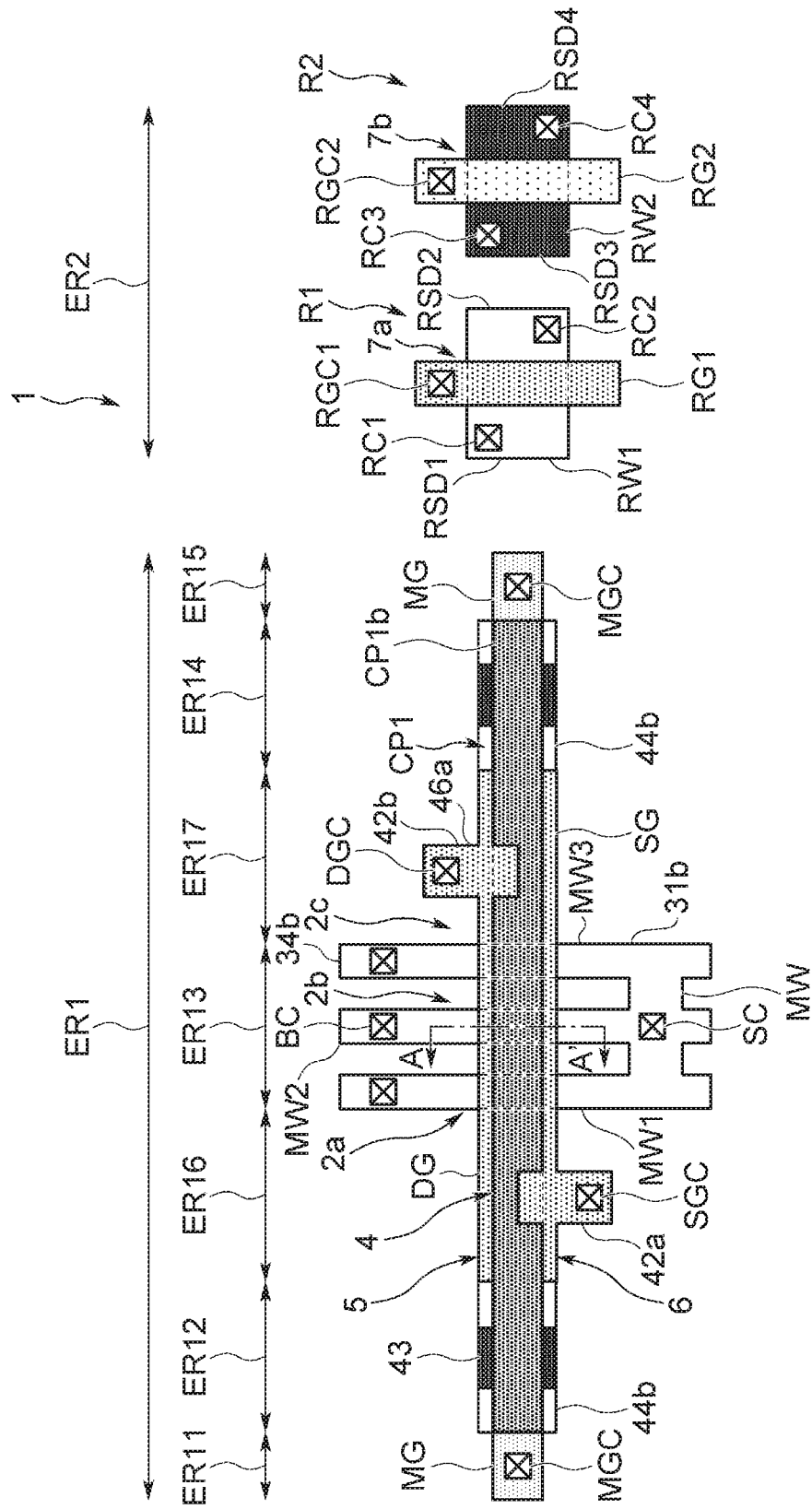
FIG. 2 is a schematic view illustrating a planar layout of a semiconductor integrated circuit device including the memory cell according to the present invention.

In a semiconductor integrated circuit device including a plurality of memory cells according to the present invention, the memory cells are disposed in a matrix of rows and columns. The semiconductor integrated circuit device additionally includes a peripheral circuit. FIG. 2 is a schematic view illustrating a planar layout of such a semiconductor integrated circuit device 1. In FIG. 2, among the memory cells disposed in the matrix, a memory circuit region ER1 includes three memory cells 2a, 2b, and 2c arranged in a direction, and a peripheral circuit region ER2 includes two peripheral circuits R1 and R2 arranged in the direction.

A sectional configuration of the memory cell 2b illustrated in FIG. 1 is a sectional configuration along line A-A' in FIG. 2. FIG. 2 does not illustrate, for example, the sidewall spacers 28a and 28b disposed on the sidewalls of the memory gate structure 4 illustrated in FIG. 1 as well as the sidewall structures SW and the silicide layers S1, S2 formed on the first select gate structure 5 and the second select gate structure 6.

As illustrated in FIG. 2, the memory circuit region ER1 includes a first select gate contact region ER16 at an end of a memory cell region ER13 on one side, and a second select gate contact region ER17 at an end of the memory cell region ER13 on the other side. The memory circuit region ER1 also includes a first select gate insulating region ER12 at an end of the first select gate contact region ER16, and a second select gate insulating region ER14 at an end of the second select gate contact region ER17. The memory circuit region ER1 also includes a first memory gate contact region ER11 at an end of the first select gate insulating region ER12, and a second memory gate contact region ER15 at an end of the second select gate insulating region ER14. The strip-shaped memory gate electrode MG is disposed in the memory circuit region ER1 across the first memory gate contact region ER11, the first select gate insulating region ER12, the first select gate contact region ER16, the memory cell region ER13, the second select gate contact region ER17, the second select gate insulating region ER14, and the second memory gate contact region ER15.

In the memory cell region ER13, the memory well MW having a predetermined shape is disposed on a surface of the substrate. For example, the memory gate structure 4 intersects with strip-shaped cell formation regions MW1, MW2, and MW3 of the memory well MW. Since the cap film CP1 is disposed on the top of the memory gate electrode MG of the memory gate structure 4 as illustrated in FIG. 1, FIG. 2 illustrates the upper cap film CP1b of the cap film CP1 across the cell formation regions MW1, MW2, and MW3 of the memory well MW.

The cell formation regions MW1, MW2, and MW3 of the memory well MW are divided into the source region 31b side and the drain region 34b side with the memory gate structure 4 as a boundary. The source regions 31b in the cell formation regions MW1, MW2, and MW3 are continuously provided and share a column-shaped source contact SC disposed in a standing manner at a predetermined position. The source contact SC is connected with a source line (not illustrated), allowing uniform application of a source voltage through this source line to the source regions 31b in the cell formation regions MW1, MW2, and MW3.

The drain regions 34b in the cell formation regions MW1, MW2, and MW3 are separated from each other and each include a column-shaped bit contact BC disposed in a standing manner. The bit contacts BC are connected with bit lines (not illustrated) different from each other, allowing individual application of a bit voltage to each bit contact BC through the corresponding bit line. In this manner, bit voltages are applied to the drain regions 34b from the different bit lines through the bit contacts BC.

In the memory cell region ER13, the first select gate structure 5 extending along the first sidewall of the memory gate structure 4 is disposed in the drain region 34b side of the memory well MW, and the second select gate structure 6 extending along the second sidewall of the memory gate structure 4 is disposed in the source region 31b side of the memory well MW. The first select gate structure 5 and the second select gate structure 6, as well as the memory gate structure 4, share the memory cells 2a, 2b, and 2c arranged in one direction.

The first select gate structure 5 includes the sidewall-shaped first select gate electrode DG disposed along the first sidewall of the memory gate structure 4 but not mounting on the memory gate structure 4. The first select gate electrode DG includes a wide select gate contact formation portion 42b disposed in the second select gate contact region ER17. The select gate contact formation portion 42b includes a flat portion 46a having a flat surface. A column-shaped first select gate contact DGC, which is connected with a first select gate line (not illustrated), is disposed in a standing manner on the flat portion 46a. This allows application of a voltage to the first select gate electrode DG having a narrow and tilted sidewall shape from the first select gate line DGL through the first select gate contact DGC and the select gate contact formation portion 42b.

In this embodiment, the select gate contact formation portion 42b, which is integrally formed with the first select gate electrode DG, has one side disposed on the cap film CP1 of the memory gate structure 4, specifically on a partial region of the cap film CP1. The select gate contact formation portion 42b has another side facing the one side, which is disposed farther from the first select gate electrode DG to form the flat portion 46a wider than the sidewall-shaped first select gate electrode DG. The flat portion 46a has a flat surface in accordance with the surface of the substrate. The second select gate structure 6 includes the sidewall-shaped second select gate electrode SG disposed along the first sidewall of the memory gate structure 4 but not disposed on the memory gate structure 4. The second select gate electrode SG includes a wide select gate contact formation portion 42a disposed in the select gate contact region ER16. The select gate contact formation portion 42a includes the flat portion 46a having a flat surface. A column-shaped second select gate contact SGC, which is connected with a second select gate line (not illustrated), is disposed in a standing on the flat portion 46a. With this configuration, a voltage from the second select gate line SGL is applied to the second select gate electrode SG, which is narrow, tilted, and sidewall-shaped, through the second select gate contact SGC and the select gate contact formation portion 42a. The select gate contact formation portion 42a integrated with the second select gate electrode SG has a configuration identical to that of the select gate contact formation portion 42b integrated with the first select gate electrode DG.

In the above-described embodiment, the select gate contact formation portions 42a and 42b each have one side disposed on the cap film CP1 of the memory gate structure 4, parts of the select gate contact formation portions 42a and 42b are disposed on partial regions of the cap film CP1, and the select gate contact formation portions 42a and 42b each have another side facing the one side, which is disposed farther from the first select gate electrode DG or the second select gate electrode SG. However, the present invention is not limited thereto. Any select gate contact formation portions having various kinds of shapes are applicable as long as they are continuously provided with the first select gate electrode DG and the second select gate electrode SG and allow the first select gate contact DGC and the second select gate contact SGC to be disposed in a standing manner.

The memory gate structure 4 extends from the memory cell region ER13 to the select gate insulating regions ER12 and ER14 at the ends of the select gate contact regions ER16 and ER17. However, unlike the memory cell region ER13, the first select gate electrode DG and the second select gate electrode SG do not extend to the select gate insulating regions ER12 and ER14. Instead of the first select gate electrode DG and the second select gate electrode SG, a sidewall-shaped i-type intrinsic semiconductor layer 44b, and a sidewall-shaped opposite-conductivity-type semiconductor layer 43 of a conductivity type (p type, in this case) different from those of the first select gate electrode DG and the second select gate electrode SG, and the sidewall-shaped intrinsic semiconductor layer 44b are disposed in this order along the sidewalls of the memory gate structure 4.

In this manner, in each of the select gate insulating regions ER12 and ER14, the i-type intrinsic semiconductor layer 44b, the p-type opposite-conductivity-type semiconductor layer 43, and the i-type intrinsic semiconductor layer 44b are disposed in this order from the corresponding one of the n-type first select gate electrode DG and the n-type second select gate electrode SG. With this arrangement, a pin junction is formed between ends of the n-type first select gate electrode DG and the n-type second select gate electrode SG to electrically insulate the first select gate electrode DG and the second select gate electrode SG from each other.

The cap film CP1, which is disposed on the memory gate electrode MG in the memory cell region ER13, the select gate insulating regions ER12 and ER14, and the select gate contact regions ER16 and ER17, prevents the upper surface of the memory gate electrode MG from being salicided through a manufacturing process.

However, no cap film CP1 is disposed on the memory gate electrode MG in the memory gate contact regions ER11 and ER15, externally exposing the memory gate electrode MG to salicide the upper surface thereof. A column-shaped memory gate contact MGC is disposed in a standing manner the upper surface through a silicide layer (not illustrated) formed on the memory gate electrode MG. The memory gate contact MGC is connected with a memory gate line (not illustrated), allowing application of a voltage through the memory gate line.

Accordingly, voltage of the memory gate line obtains is applied to the memory gate electrode MG through the memory gate contact MGC. As described above, in the semiconductor integrated circuit device 1, the memory gate electrode MG is covered by the cap film CP1 in the memory cell region ER13, the select gate contact regions ER16 and ER17, and the select gate insulating regions ER12 and ER14. However, a voltage can be applied to the memory gate electrode MG in the memory cell region ER13 by means of application of a voltage through the memory gate contact MGC from the memory gate electrode MG exposed in the memory gate contact regions ER11 and ER15.

The following describes the peripheral circuit region ER2 adjacent to the memory circuit region ER1. In this embodiment, the peripheral circuit region ER2 is disposed at a position adjacent to the memory gate contact region ER15 on the other side in the memory circuit region ER1, but the present invention is not limited thereto. The peripheral circuit region ER2 may be disposed at any of various positions such as a position adjacent to the memory gate contact region ER11 disposed on the one side, a position adjacent to the select gate insulating regions ER12 and ER14, a position adjacent to the select gate contact regions ER16 and ER17, a position adjacent to the memory cell region ER13, a position adjacent to a region between the memory cell region ER13 and the select gate contact region ER16 (ER17), and a position adjacent to a region between the select gate contact region ER16 (ER17) and the select gate insulating region ER12 (ER14).

The peripheral circuit region ER2 includes a p-type logic well RW1 and an n-type logic well RW2 disposed on the surface of the substrate. A peripheral circuit R1 included in an n-type MOS transistor structure is disposed in the logic well RW1 on the one side, and a peripheral circuit R2 included in a p-type MOS transistor structure is disposed in the logic well RW2 on the other side. A logic gate structure 7a including a logic gate electrode RG1 is disposed on a gate insulating film (not illustrated) in the logic well RW1. A logic gate voltage is applied to the logic gate electrode RG1 through a contact RGC1.

The logic well RW1 includes regions on the respective sides of the logic gate structure 7a. An n-type first source-drain region RSD1 is disposed in one of the regions adjacent to the logic gate structure 7a. An n-type second source-drain region RSD2 is disposed in the other region adjacent to the logic gate structure 7a. In the logic well RW1, a contact RC1 is disposed in a standing manner in the first source-drain region RSD1, and another contact RC2 is disposed in a standing manner in the second source-drain region RSD2. A voltage is applied to each of the source-drain regions RSD1 and RSD2 through the corresponding one of the contacts RC1 and RC2.

A logic gate structure 7b including a logic gate electrode RG2 is disposed on a gate insulating film (not illustrated) in the logic well RW2. A logic gate voltage is applied to the logic gate electrode RG2 through a contact RGC2. The logic well RW2 includes regions on the respective sides of the logic gate structure 7b. A p-type first source-drain region RSD3 is disposed in one of the regions adjacent to the logic gate structure 7b. A p-type second source-drain region RSD4 is disposed in the other region adjacent to the logic gate structure 7b. In the logic well RW2, a contact RC3 is disposed in a standing manner in the first source-drain region RSD3, and another contact RC4 is disposed in a standing manner in the second source-drain region RSD4. A voltage is applied to each of the source-drain regions RSD3 and RSD4 through the corresponding one of the contacts RC3 and RC4.

The above-described embodiment describes the peripheral circuit region ER2 in which the peripheral circuit R1 included in an n-type MOS transistor structure is disposed in the logic well RW1 and the peripheral circuit R2 included in a p-type MOS transistor structure is disposed in the logic well RW2. However, the present invention is not limited thereto. The peripheral circuit region ER2 may include the peripheral circuits R1 and R2 both in a p-type or n-type MOS transistor structures.

(3) Method for Manufacturing Semiconductor Integrated Circuit Device

The semiconductor integrated circuit device 1 having the above-described configuration is produced according to the following manufacturing process. Accordingly, the cap film in the memory gate contact regions ER11 and ER15 is removed to provide the memory gate electrode MG with a region in which the memory gate contact MGC is to be disposed in a standing manner without an additional dedicated photomask step of fabricating the memory circuit region ER1. Simultaneously, the first select gate electrode DG and the second select gate electrode SG are physically disconnected from each other in the memory gate contact regions ER11 and ER15. Specifically, as illustrated in FIG. 3, first, the memory well MW having a predetermined shape is formed on the surface of the substrate in the memory circuit region ER1, the logic wells RW1 and RW2 are formed on the surface of the substrate in the peripheral circuit region ER2, and the memory gate structure 4 is formed across the first memory gate contact region ER11, the first select gate insulating region ER12, the first select gate contact region ER16, the memory cell region ER13, the second select gate contact region ER17, the second select gate insulating region ER14, and the second memory gate contact region ER15 of the memory circuit region ER1.

Then, a layer-shaped select gate electrode formation layer 50 in which, for example, n-type impurities are implanted is formed in each of the memory cell region ER13 and the select gate contact regions ER16 and ER17 of the memory circuit region ER1. In addition, a layer-shaped intrinsic semiconductor layer 44 made of an intrinsic semiconductor (i-type), in which no impurities are implanted, is formed in each of the memory gate contact regions ER11 and ER15 and the select gate insulating regions ER12 and ER14. In the peripheral circuit region ER2, a layer-shaped logic gate electrode formation layer 51 in which, for example, n-type impurities are implanted is formed to cover the entire logic well RW1, and a layer-shaped logic gate electrode formation layer 52 in which p-type impurities are implanted is formed to cover the entire logic well RW2.

Figure 4A:
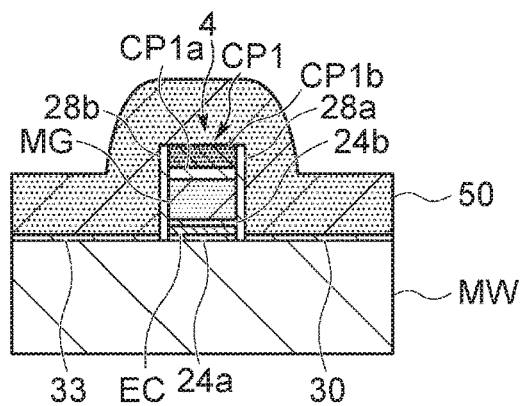
FIG. 4A is a schematic view illustrating a sectional configuration along line A1-A1' in FIG. 3.

FIG. 4A illustrates a sectional configuration along line A1-A1' in FIG. 3. As illustrated in FIG. 4A, the memory gate structure 4 including the lower gate insulating film 24a, the charge storage layer EC, the upper gate insulating film 24b, the memory gate electrode MG, and the cap film CP1 stacked in this order is formed over the memory well MW in the memory cell region ER13. The cap film CP1 includes the lower cap film CP1a disposed on the memory gate electrode MG, and the upper cap film CP1b disposed on the lower cap film CP1a. Although illustrates in FIG. 3, the sidewall spacers 28a and 28b having predetermined widths are disposed on the sidewalls of the memory gate structure 4 as illustrated in FIG. 4A.

On the surface of the memory well MW, the first select gate insulating film 30 is disposed in a region closer to the first sidewall spacer 28a provided on the sidewalls of the memory gate structure 4, and the second select gate insulating film 33 is disposed in a region closer to the second sidewall spacer 28b provided on the sidewalls of the memory gate structure 4. The select gate electrode formation layer 50 is disposed to cover the memory gate structure 4, the sidewall spacers 28a and 28b, the first select gate insulating film 30, and the second select gate insulating film 33.

Figure 4B:
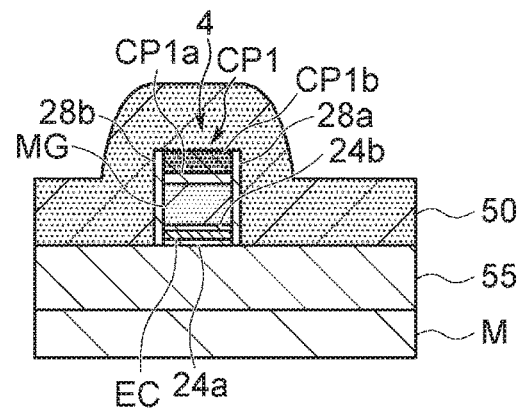
FIG. 4B is a schematic view illustrating a sectional configuration along line B1-B1' in FIG. 3.

As illustrated in FIG. 4B, which illustrates a sectional configuration along line B1-B1' in FIG. 3, in a region in the memory cell region ER13, in which the select gate contact formation portion 42b (FIG. 2) is to be formed, the memory gate structure 4, the sidewall spacers 28a and 28b, and the layer-shaped select gate electrode formation layer 50 are disposed on an element isolation layer 55 made of an insulating material and disposed on a well M. The layer-shaped select gate electrode formation layer 50 covers the memory gate structure 4, the sidewall spacers 28a and 28b, and the element isolation layer 55.

Figure 4C:
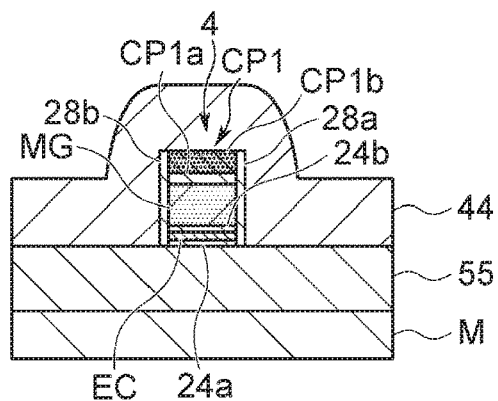
FIG. 4C is a schematic view illustrating a sectional configuration along line C1-C1' in FIG. 3.

As illustrated in FIG. 4C, which illustrates a sectional configuration along line C1-C1' in FIG. 3, in the memory gate contact region ER15, the memory gate structure 4, the sidewall spacers 28a and 28b, and the layer-shaped i-type intrinsic semiconductor layer 44 are disposed on the element isolation layer 55 disposed on the well M. The layer-shaped i-type intrinsic semiconductor layer 44 covers the memory gate structure 4, the sidewall spacers 28a and 28b, and the element isolation layer 55.

Figure 4D:
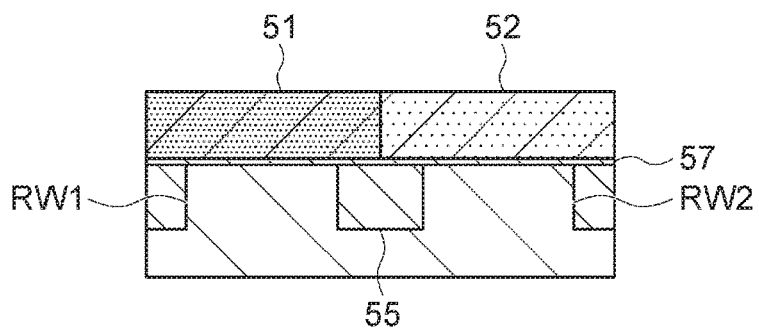
FIG. 4D is a schematic view illustrating a sectional configuration along line D1-D 1' in FIG. 3.

As illustrated in FIG. 4D, which illustrates a sectional configuration along line D1-D1' in FIG. 3, in the peripheral circuit region ER2, the element isolation layer 55 made of an insulating material insulates the logic well RW1 and the logic well RW2 from each other. A layer-shaped gate insulating film 57 is disposed on surfaces of the logic wells RW1 and RW2 and the element isolation layer 55. In the peripheral circuit region ER2, the layer-shaped n-type logic gate electrode formation layer 51 is disposed on the gate insulating film 57 to cover around the logic well RW1 and the logic well RW1. In addition, in the peripheral circuit region ER2, the layer-shaped p-type logic gate electrode formation layer 52 is disposed on the gate insulating film 57 to cover around the logic well RW2 and the logic well RW2.

Figure 5:
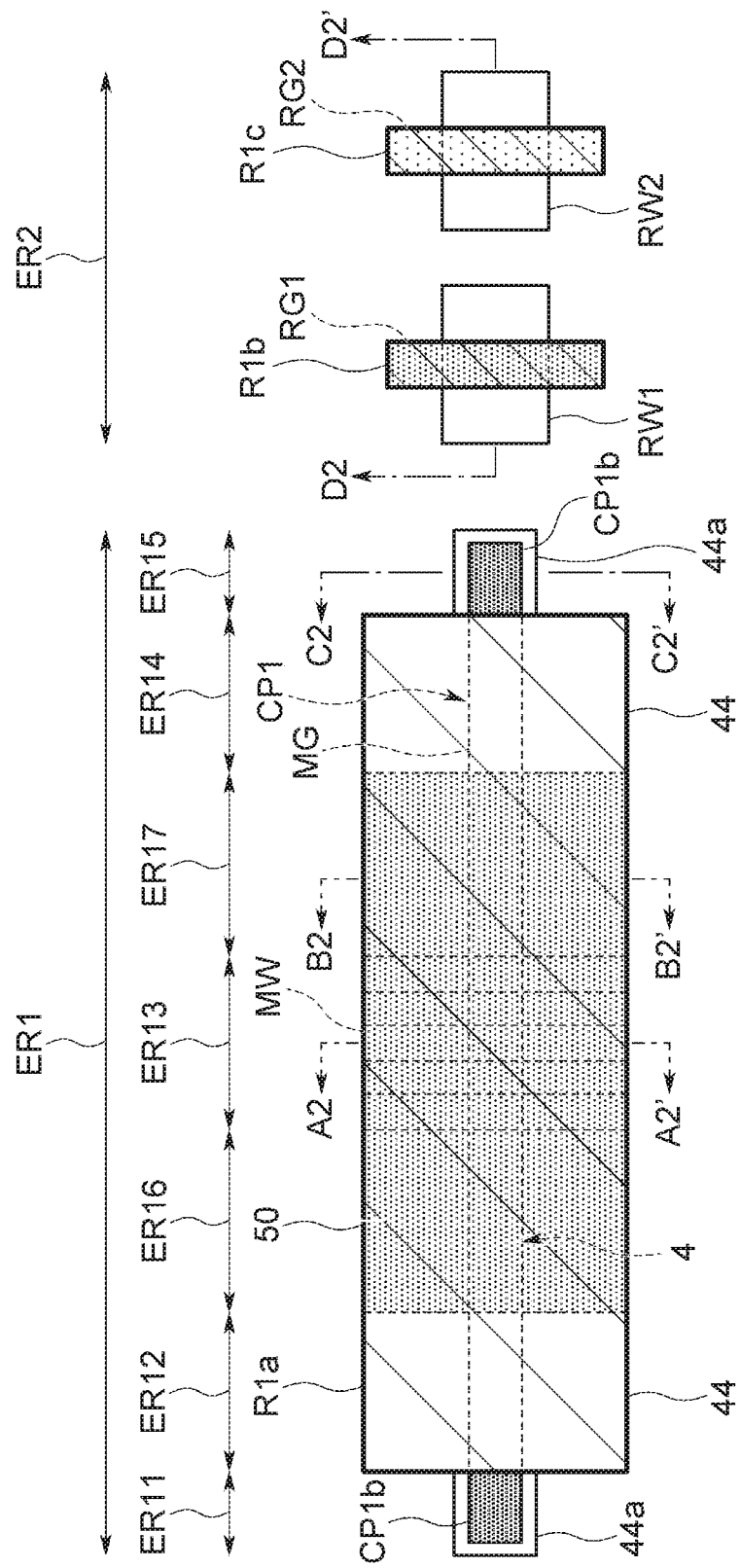
FIG. 5 is a schematic view illustrating manufacturing process (2) for a semiconductor integrated circuit device.

Then, the process proceeds to a logic gate electrode formation step. As illustrated in FIG. 5, in which any corresponding part to that in FIG. 3 is denoted by an identical reference sign, the memory cell region ER13, the select gate contact regions ER16 and ER17, and the select gate insulating regions ER12 and ER14 of the memory circuit region ER1 are covered by a patterned resist R1a in the logic gate electrode formation step. Simultaneously, in the logic gate electrode formation step, the logic gate electrode formation layers 51 and 52 in the peripheral circuit region ER2 are covered by resists R1b and R1c patterned according to the outline shapes of the logic gate electrodes RG1 and RG2 (FIG. 2) to be formed last.

Then, the intrinsic semiconductor layer 44 in the memory gate contact regions ER11 and ER15 exposed out of the resist R1a in the memory circuit region ER1 is removed by dry etching, and the logic gate electrode formation layers 51 and 52 being exposed out of the resists R1b and R1c in the peripheral circuit region ER2 are removed by dry etching.

Accordingly, in the memory gate contact regions ER11 and ER15, the intrinsic semiconductor layer 44 being externally exposed is removed to expose the upper cap film CP1b of the memory gate structure 4 and form a sidewall-shaped intrinsic semiconductor layer 44a around the sidewalls of the memory gate structure 4. Simultaneously, in the memory gate contact regions ER11 and ER15, a surface of the upper cap film CP1b is partially removed to reduce the thickness of the upper cap film CP1b. As a result, the select gate electrode formation layer 50 remains intact in the memory cell region ER13, the select gate contact regions ER16 and ER17, and the select gate insulating regions ER12 and ER14 being covered by the resist R1a in the memory circuit region ER1, and thus the sidewall-shaped intrinsic semiconductor layer 44a and the upper cap film CP1b having the reduced thickness are formed in the memory gate contact and select gate physical disconnected regions ER11 and ER15.

Simultaneously, in the peripheral circuit region ER2, the logic gate electrode formation layers 51 and 52 being not covered by the resists R1b and R1c is removed, whereas the logic gate electrode formation layers 51 and 52 remain in regions covered by the resists R1b and R1c. Accordingly, the logic gate electrodes RG1 and RG2 are formed. As a result, in the peripheral circuit region ER2, the logic gate electrode RG1 is disposed in the logic well RW1, and the logic gate electrode RG2 is disposed in the logic well RW2.

Figure 6A:
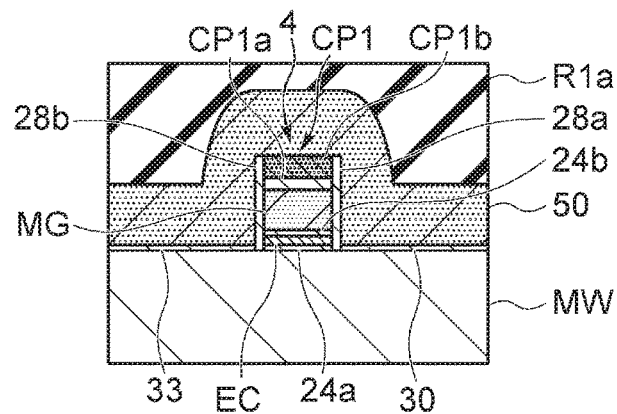
FIG. 6A is a schematic view illustrating a sectional configuration along line A2-A2' in FIG. 5.
Figure 6B:
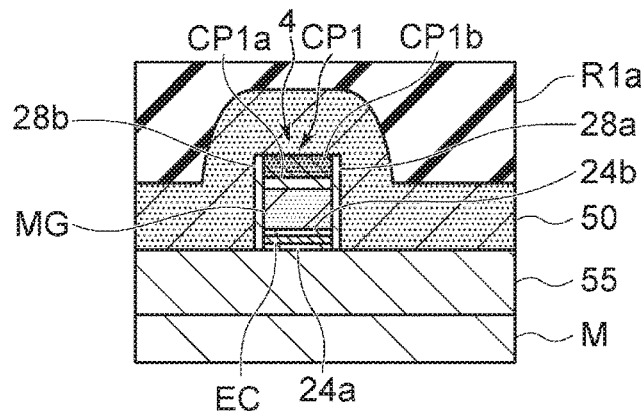
FIG. 6B is a schematic view illustrating a sectional configuration along line B2-B2' in FIG. 5.

FIG. 6A illustrates a sectional configuration along line A2-A2' in FIG. 5. As illustrated in FIG. 6A, the select gate electrode formation layer 50 is covered by the resist R1a in the memory cell region ER13, and thus the select gate electrode formation layer 50 remains in a layer-shaped structure. As illustrated in FIG. 6B, which illustrates a sectional configuration along line B2-B2' in FIG. 5, the select gate electrode formation layer 50 is covered by the resist R1a also in the select gate contact regions ER16 and ER17 in which the contact formation portion 42b (FIG. 2) is to be formed, and thus the select gate electrode formation layer 50 remains in a layer-shaped structure.

Figure 6C:
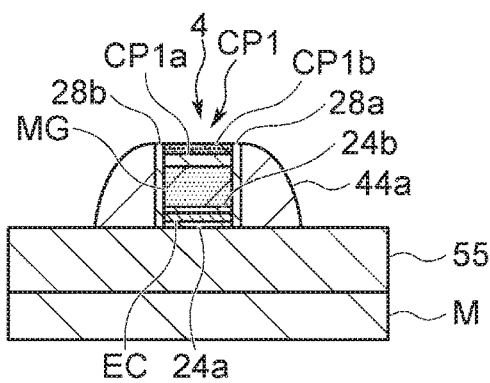
FIG. 6C is a schematic view illustrating a sectional configuration along line C2-C2' in FIG. 5.

As illustrated in FIG. 6C, which illustrates a sectional configuration along line C2-C2' in FIG. 5, in the memory gate contact region ER15, the intrinsic semiconductor layer 44 being not covered by the resist R1a is removed to externally expose the cap film CP1 of the memory gate structure 4 and form the sidewall-shaped intrinsic semiconductor layer 44a along the sidewall spacers 28a and 28b on the sidewalls of the memory gate structure 4. When the intrinsic semiconductor layer 44 is removed, the surface of the cap film CP1 in the memory gate contact region ER15 is partially removed too. As a result, the thickness of the upper cap film CP1b in the memory gate contact region ER15 is smaller than the thickness of the upper cap film CP1b in the memory cell region ER13, the select gate contact regions ER16 and ER17, the select gate insulating regions ER12 and ER14 being covered by the resist R1a.

Figure 6D:
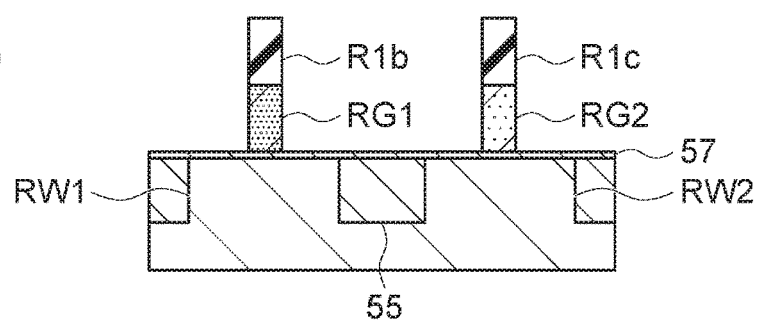
FIG. 6D is a schematic view illustrating a sectional configuration along line D2-D2' in FIG. 5.

As illustrated in FIG. 6D, which illustrates a sectional configuration along line D2-D2' in FIG. 5, the logic gate electrode formation layers 51 and 52 remain in partial regions of the logic wells RW1 and RW2 being covered by the resists R1b and R1c in the peripheral circuit region ER2, and thus the logic gate electrodes RG1 and RG2 are formed. Accordingly, in the peripheral circuit region ER2, the logic gate electrode RG1 is provided on the logic well RW1 through the gate insulating film 57, and the logic gate electrode RG2 is provided on the logic well RW2 through the gate insulating film 57.

In this manner, in the logic gate electrode formation step, the logic gate electrode formation layers 51 and 52 in the peripheral circuit region ER2 are patterned by using the resists R1b and R1c to form the logic gate electrodes RG1 and RG2 and simultaneously reduce the thickness of the upper cap film CP1b by partially removing the surface of the upper cap film CP1b in the memory gate contact region ER15.

Figure 7:
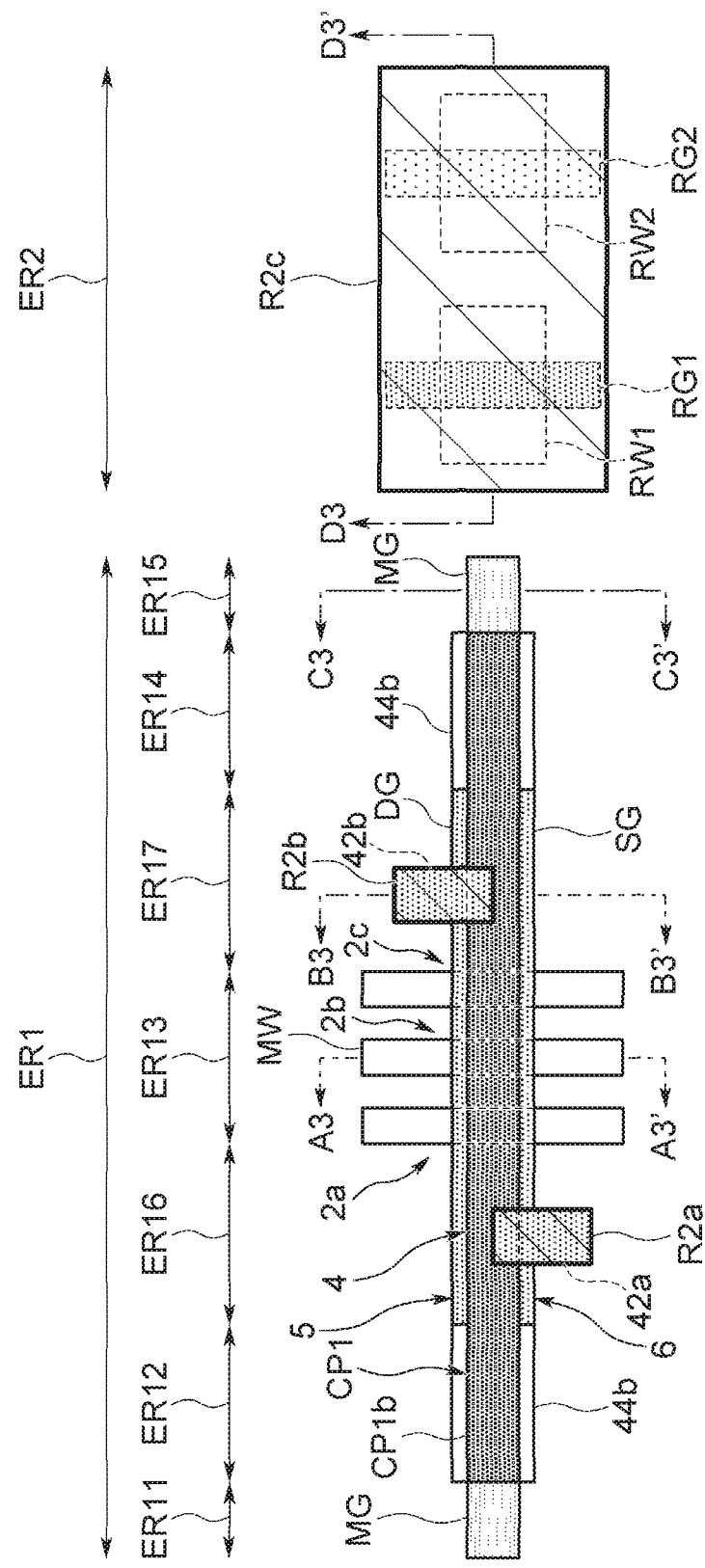
FIG. 7 is a schematic view illustrating manufacturing process (3) for a semiconductor integrated circuit device.

After the resists R1a, R1b, and R1c are removed, the process proceeds to a subsequent select gate electrode formation step. In the select gate electrode formation step, as illustrated in FIG. 7, in which any corresponding part to that in FIG. 5 is denoted by an identical reference sign, a partial region of the select gate electrode formation layer 50 (FIG. 5) around the memory gate structure 4 is covered by patterned resists R2a and R2b in the select gate contact regions ER16 and ER17, and the entire peripheral circuit region ER2 is covered by a resist R2c. Then, the select gate electrode formation layer 50 being not covered by the resists R2a and R2b in the memory circuit region ER1, and the intrinsic semiconductor layer 44 in the select gate insulating regions ER12 and ER14 are removed by dry etching using, for example, chlorine-based gas.

Accordingly, in the memory cell region ER13, a region of the select gate electrode formation layer 50 being not covered by the resists R2a and R2b is removed to externally expose the cap film CP1 of the memory gate structure 4 and shape the select gate electrode formation layer 50 in a sidewall shape along both sidewalls of the memory gate structure 4. As a result, the first select gate electrode DG sidewall-shaped along one of the sidewalls of the memory gate structure 4, and the second select gate electrode SG physically disconnected from the first select gate electrode DG and sidewall-shaped along the other sidewall of the memory gate structure 4 are provided in the memory cell region ER13.

Simultaneously, in the select gate contact regions ER16 and ER17 of the memory circuit region ER1, the layer-shaped select gate electrode formation layer 50 remains intact in regions covered by the resists R2a and R2b. Accordingly, the select gate contact formation portion 42b is provided continuously with the first select gate electrode DG, and the select gate contact formation portion 42a is provided continuously with the second select gate electrode SG.

Simultaneously, in the select gate insulating regions ER12 and ER14, the intrinsic semiconductor layer 44 is removed to externally expose the cap film CP1 of the memory gate structure 4 and shape the intrinsic semiconductor layer 44b in a sidewall shape along both sidewalls of the memory gate structure 4. Simultaneously, in the memory gate contact regions ER11 and ER15, the upper cap film CP1b of the cap film CP1 being externally exposed is removed, and also the sidewall-shaped intrinsic semiconductor layer (semiconductor layer) 44a around the memory gate electrode MG is removed.

The surface of the upper cap film CP1b in the memory gate contact regions ER11 and ER15 has been partially removed by dry etching in advance in the logic gate electrode formation step illustrated in FIG. 5, and thus has a thickness smaller than that of the upper cap film CP1b in the memory cell region ER13, the select gate contact regions ER16 and ER17, and the select gate insulating regions ER12 and ER14. Thus, when the upper cap film CP1b in the memory gate contact regions ER11 and ER15 is entirely removed by dry etching, the upper cap film CP1b in the memory cell region ER13, the select gate contact regions ER16 and ER17, and the select gate insulating regions ER12 and ER14 only has a reduced thickness and remains on the memory gate electrode MG.

Then, the lower cap film CP1a is removed by dry etching in place of the select gate electrode formation layer 50 and the upper cap film CP1b. Specifically, the lower cap film CP1a, which is made of, for example, $SiO_2$ and exposed in the memory gate contact regions ER11 and ER15, is removed by dry etching with different etching gas (for example, dry etching with fluorine gas) to expose the memory gate electrode MG in the memory gate contact regions ER11 and ER15.

For example, when the cap film CP1 is a single-layer cap film having a single-layer structure made of $SiO_2$, the element isolation layer 55, which is made of the same material such as $SiO_2$, is removed by the same amount at removal of the single-layer cap film in the memory gate contact regions ER11 and ER15. This generates a step between the substrate surface of, for example, a memory well made of Si and the element isolation layer 55, which potentially affects element characteristics.

In this embodiment, however, the cap film CP1 has a stacked structure including the lower cap film CP1a and the upper cap film CP1b, and the upper cap film CP1b is made of SiN. Thus, it is possible to only remove the upper cap film CP1b by utilizing selectivity between SiN and $SiO_2$ at dry etching while suppressing removal of the element isolation layer 55. Accordingly, the present invention can suppress generation of a step between the substrate surface of, for example, a memory well made of Si and the element isolation layer 55 when the cap film CP1 is removed, thereby reducing influence on element characteristics due to the step of removing the cap film CP1.

Figure 8A:
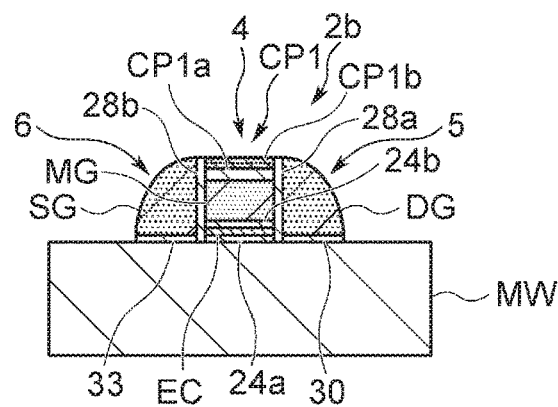
FIG. 8A is a schematic view illustrating a sectional configuration along line A3-A3' in FIG. 7.

FIG. 8A illustrates a sectional configuration along line A3-A3' in FIG. 7. As illustrated in FIG. 8A, in the memory cell region ER13, the surface of the memory well MW and the select gate electrode formation layer 50 around the memory gate structure 4 are removed by dry etching to externally expose the cap film CP1 of the memory gate structure 4, and the surface of the upper cap film CP1b of the cap film CP1 is partially removed by dry etching to reduce the thickness of the upper cap film CP1b.

Simultaneously, in the memory cell region ER13, the select gate electrode formation layer 50 remains in a sidewall shape along the sidewall spacers 28a and 28b on the sidewalls of the memory gate structure 4 to form the sidewall-shaped first select gate electrode DG and the second select gate electrode SG along the sidewall spacers 28a and 28b. In addition, the first select gate insulating film 30 and the second select gate insulating film 33 being externally exposed on the surface of the memory well MW are removed by dry etching in the memory cell region ER13. Eventually, the first select gate insulating film 30 and the second select gate insulating film 33 remain only on the surface of the memory well MW covered by the sidewall-shaped first select gate electrode DG and the second select gate electrode SG.

Accordingly, the first select gate structure 5, in which the sidewall-shaped first select gate electrode DG is disposed in a standing manner on the first select gate insulating film 30, and the second select gate structure 6, in which the sidewall-shaped second select gate electrode SG is disposed in a standing manner on the second select gate insulating film 33, are formed on the memory well MW. As a result, the memory cell 2b, in which the sidewall-shaped first select gate structure 5 and the sidewall-shaped second select gate structure 6 are disposed facing each other on the sidewalls of the memory gate structure 4 through the sidewall spacers 28a and 28b, is formed in the memory cell region ER13.

In this embodiment, the first select gate electrode DG and the second select gate electrode SG, which are disposed along the sidewalls of the memory gate structure 4 through the sidewall spacers 28a and 28b, each has a sidewall shape in which the height of the select gate electrode decreases with the distance from the memory gate structure 4 such that the top portion of the select gate electrode slopes down toward the memory well MW.

Figure 8B:
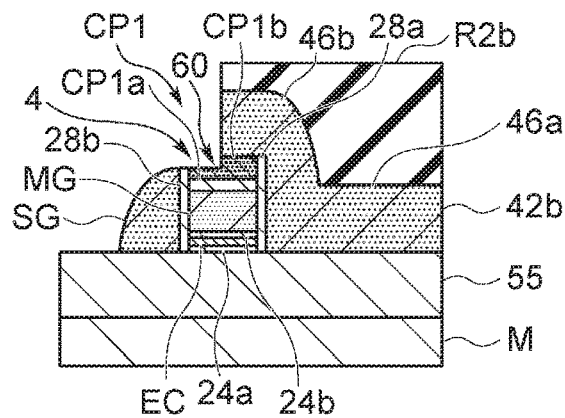
FIG. 8B is a schematic view illustrating a sectional configuration along line B3-B3' in FIG. 7.

Simultaneously, as illustrated in FIG. 8B, which illustrates a sectional configuration along line B3-B3' in FIG. 7, the select gate electrode formation layer 50 being covered by the resist R2b remains intact in the select gate contact region ER17 in which the resist R2b is disposed, thereby forming the select gate contact formation portion 42b. The select gate contact formation portion 42b includes the flat portion 46a disposed on the element isolation layer 55 and having a flat surface in accordance with the shape of the substrate surface of the element isolation layer 55, and a mounting portion 46b integrally formed with the flat portion 46a and disposed on part of the cap film CP1 of the memory gate structure 4.

In this case, the flat-surface flat portion 46a of the select gate contact formation portion 42b allows the column-shaped first select gate contact DGC, which is formed in a later step, to be easily provided in a vertical manner on the surface of the flat portion 46a. Since the resist R2b covers a partial region of the cap film CP1, the select gate electrode formation layer 50 partially remains intact above the cap film CP1 to form, on the upper cap film CP1b, the mounting portion 46b integrally formed with the flat portion 46a.

Since the surface of the upper cap film CP1b in a region of the cap film CP1 being not covered by the resist R2b in the select gate contact region ER17 is partially removed by dry etching to have a reduced thickness, a step 60 is formed between the upper cap film CP1b being covered by the resist R2b and the upper cap film CP1b being not covered by the resist R2b.

Figure 8C:
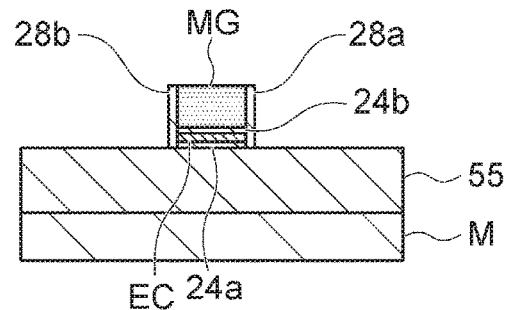
FIG. 8C is a schematic view illustrating a sectional configuration along line C3-C3' in FIG. 7.
Figure 8D:
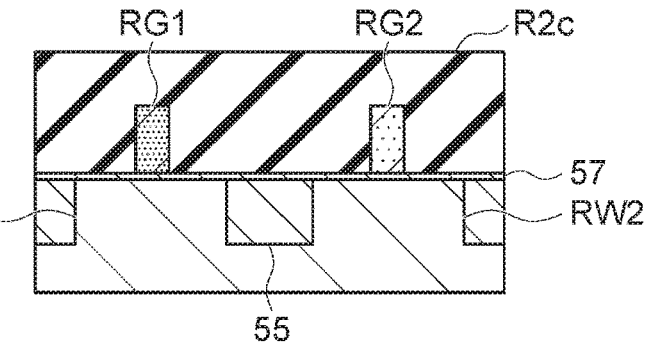
FIG. 8D is a schematic view illustrating a sectional configuration along line D3-D3' in FIG. 7.

As illustrated in FIG. 8C, which illustrates a sectional configuration along line C3-C3' in FIG. 7, the sidewall-shaped intrinsic semiconductor layer 44a disposed along the sidewall spacers 28a and 28b on the sidewalls of the memory gate structure 4 is entirely removed by dry etching in the memory gate contact region ER15, when the select gate electrode formation layer 50 in the memory cell region ER13 and the select gate contact regions ER16 and ER17 is removed by dry etching. Simultaneously, in the memory gate contact region ER15, the upper cap film CP1b being externally exposed and having a reduced thickness, and the lower cap film CP1a covered by the upper cap film CP1b are removed in this order by dry etching with different etching gas to externally expose the memory gate electrode MG. As illustrated in FIG. 8D, which illustrates a sectional configuration along line D3-D3' in FIG. 7, the logic gate electrodes RG1 and RG2, which are covered by the resist R2c, on the gate insulating film 57 remain intact in the peripheral circuit region ER2.

Subsequently, the resists R2a, R2b, and R2c are removed, the process proceeds to an impurity implantation step. In the impurity implantation step, as illustrated in FIG. 9, in which any corresponding part to that in FIG. 7 is denoted by an identical reference sign, the memory circuit region ER1 and the peripheral circuit region ER2 are covered by a resist R3 including openings H1, H2, and H3 at predetermined positions, and impurities are implanted into regions externally exposed out of the openings H1, H2, and H3. In this case, parts of the intrinsic semiconductor layer 44b disposed facing to each other with respect to the memory gate structure 4 are externally exposed out of the openings H1 and H2 of the resist R3 in the select gate insulating regions ER12 and ER14 of the memory circuit region ER1.

In the select gate insulating regions ER12 and ER14, the intrinsic semiconductor layer 44b, which is covered by the resist R3 on both sides of each of the openings H1 and H2, remains in regions adjacent to the memory cell region ER13, and also in regions adjacent to the memory gate contact regions ER11 and ER15. In addition, the memory cell region ER13 and the memory gate contact regions ER11 and ER15 are covered by the resist R3 in the memory circuit region ER1.

In the impurity implantation step, p-type impurities, the conductivity type of which is different from those of the n-type first select gate electrode DG and the n-type second select gate electrode SG, are implanted into the intrinsic semiconductor layer 44b exposed out of the openings H1 and H2 to form, as the p-type opposite-conductivity-type semiconductor layer 43, the intrinsic semiconductor layer 44b exposed out of the openings H1 and H2. Accordingly, the i-type intrinsic semiconductor layer 44b, the p-type opposite-conductivity-type semiconductor layer 43, and the i-type intrinsic semiconductor layer 44b are formed in the select gate insulating region ER12 (ER14) between the memory cell region ER13 and the memory gate contact region ER11 (ER15).

As a result, a pin junction diode is formed across the memory cell region ER13 and the select gate insulating regions ER12 and ER14 of the memory circuit region ER1 as a junction of the n-type first select gate electrode DG and the n-type second select gate electrode SG in the memory cell region ER13 and the intrinsic semiconductor layer 44b in the select gate insulating region ER12 (ER14). The pin junction diode formed in the memory cell region ER13 and the select gate insulating regions ER12 and ER14 electrically insulates the first select gate electrode DG and the second select gate electrode SG in the memory circuit region ER1.

Simultaneously, in the peripheral circuit region ER2, the logic well RW1 and the logic gate electrode RG1 on the logic well RW1 are covered by the resist R3, and the logic well RW2 and the logic gate electrode RG2 on the logic well RW2 are externally exposed out of the opening H3 of the resist R3. Accordingly, in the peripheral circuit region ER2, p-type impurities, the conductivity type of which is same as that of impurities implanted into the memory circuit region ER1, are implanted into the logic well RW2 externally exposed out of the opening H3 to form the p-type source-drain regions RSD3 and RSD4 in regions of the logic well RW2.

After the resist R3 is removed, the gate insulating film 57 externally exposed on the logic wells RW1 and RW2 in the peripheral circuit region ER2 is removed, while the gate insulating film 57 directly below the logic gate electrodes RG1 and RG2 is left intact, to form the logic gate electrodes RG1 and RG2 and the logic gate structures 7a and 7b made of the patterned gate insulating film 57. Thereafter, the semiconductor integrated circuit device 1 is manufactured by sequentially performing, for example, a step of forming the n-type source-drain regions RSD1 and RSD2, a step of forming the silicide layers S1, S2, and S and the like on the first select gate electrode DG and the second select gate electrode SG, and a step of forming an interphase insulation layer, the first select gate contact DGC, the second select gate contact SGC, the memory gate contact MGC, the contacts RGC1, RG2, RC1, RC2, RC3, and RC4, and the like.

(4) Operations and Effects

In the above-described configuration, the memory cell 2b includes the memory gate structure 4, the sidewall-shaped first select gate structure 5, and the sidewall-shaped second select gate structure 6. The memory gate structure 4 includes the lower gate insulating film 24a, the charge storage layer EC, the upper gate insulating film 24b, the memory gate electrode MG, and the cap film CP1 stacked in this order over the memory well MW between the drain region 34b and the source region 31b. The first select gate structure 5 is disposed along a sidewall of the sidewall spacer 28a provided on the first sidewall of the memory gate structure 4. The second select gate structure 6 is disposed along a sidewall of the sidewall spacer 28b provided on the second sidewall of the memory gate structure 4.

The first select gate structure 5 includes the sidewall-shaped first select gate electrode DG through the first select gate insulating film 30 over the memory well MW between the drain region 34b connected with the bit line BL and the first sidewall spacer 28a provided on the sidewalls of the memory gate structure 4, and includes the silicide layer S1 on the first select gate electrode DG.

The second select gate structure 6 includes the sidewall-shaped second select gate electrode SG through the second select gate insulating film 33 on the memory well MW between the source region 31b connected with the source line SL and the second sidewall spacer 28b provided on the sidewalls of the memory gate structure 4, and includes the silicide layer S2 on the second select gate electrode SG.

As described above, in the memory cell 2b according to the present invention, the first select gate electrode DG and the second select gate electrode SG are sidewall-shaped along the sidewalls of the memory gate structure 4. With this configuration, the memory gate structure 4 is not disposed on the first select gate electrode DG and the second select gate electrode SG. Thus, the memory gate structure 4, the first select gate structure 5, and the second select gate structure 6 can have equal heights. Accordingly, the memory gate structure 4 does not protrude from the first select gate electrode DG and the second select gate electrode SG, thereby achieving reduction in size as compared to a conventional case.

In the memory cell 2b, the first select gate electrode DG and the second select gate electrode SG are sidewall-shaped near the memory gate electrode MG, whereas the cap film CP1 having a predetermined thickness is provided on the memory gate electrode MG. With this configuration, the silicide layer Si on the first select gate electrode DG and the silicide layer S2 on the second select gate electrode SG are separated farther from the memory gate electrode MG by the thickness of the cap film CP1. Accordingly, the silicide layers Si and S2 on the first select gate electrode DG and the second select gate electrode SG are unlikely to contact with the memory gate electrode MG, thereby preventing a short-circuit defect of the memory gate electrode MG.

In the memory cell 2b, the first programming method is employed to prevent charge injection into the charge storage layer EC at application of, to the memory gate electrode MG, the charge storage gate voltage needed to inject charge into the charge storage layer EC. In this method, once carriers induced in the channel layer formation carrier region of the memory well MW facing the memory gate electrode MG are removed from the channel layer formation carrier region, the first select gate structure 5 blocks the electrical connection between the region of the memory well MW facing the memory gate electrode MG and the drain region 34b, and the second select gate structure 6 blocks the electrical connection between the region of the memory well MW facing the memory gate electrode MG and the source region 31b.

As a result, in the memory cell 2b, the depleted layer instead of a channel layer is formed in the channel layer formation carrier region. The potential at the surface of the memory well MW increases accordingly in accordance with the charge storage gate voltage to reduce the voltage difference between the memory gate electrode MG and the surface of the memory well MW, thereby preventing charge injection into the charge storage layer EC. In addition, the depleted layer prevents application of the potential at the surface of the memory well MW directly below the memory gate structure 4 to the first select gate insulating film 30 and the second select gate insulating film 33.

Thus, in the memory cell 2b, the voltage values of the bit line BL and the source line SL can be reduced irrespective of a high charge storage gate voltage needed to inject charge into the charge storage layer EC by the quantum tunneling effect. The reduction can be made to voltage values needed to block, through the first select gate structure 5, the electrical connection between the region of the memory well MW facing the memory gate electrode MG and the bit line BL, and also to voltage values needed to block, through the second select gate structure 6, the electrical connection between the region of the memory well MW facing the memory gate electrode MG and the source line SL. Thus, in the memory cell 2b, the voltage reduction of the bit line BL and the source line SL allows reduction in the thickness of the first select gate insulating film 30 of the first select gate structure 5 and the thickness of the second select gate insulating film 33 of the second select gate structure 6, thereby achieving a faster operation accordingly.

When the charge storage gate voltage necessary for charge injection into the charge storage layer EC is applied to the memory gate electrode MG to form a channel layer at the surface of the memory well MW facing the memory gate electrode MG while no charge is to be injected into the charge storage layer EC of the memory cell 2b by the second programming method, the first select gate structure 5 blocks electrical connection between the drain region 34b and the channel layer, and the second select gate structure 6 blocks electrical connection between the source region 31b and the channel layer.

Thus, in the memory cell 2b, the depleted layer is formed around the channel layer of the memory well MW facing the memory gate structure 4, and the channel potential of the channel layer increases in accordance with the charge storage gate voltage. Accordingly, the voltage difference between the memory gate electrode MG and the channel layer is reduced to prevent charge injection into the charge storage layer EC. Simultaneously, the depleted layer blocks voltage application from the channel layer to the first select gate insulating film 30 and the second select gate insulating film 33.

Thus, in the memory cell 2b, the voltage values of the bit line BL and the source line SL connected to the first select gate structure 5 and the second select gate structure 6, respectively, can be reduced irrespective of a high charge storage gate voltage needed to inject charge into the charge storage layer EC by the quantum tunneling effect. The reduction can be made to voltage values needed to block the electrical connection between the bit line BL and the channel layer and the electrical connection between the source line SL and the channel layer. Thus, in the memory cell 2b, along with the voltage reduction at the bit line BL and the source line SL, reduction can be made in the thickness of the first select gate insulating film 30 of the first select gate structure 5 and the thickness of the second select gate insulating film 33 of the second select gate structure 6, thereby achieving faster operation.

In the method for manufacturing the semiconductor integrated circuit device 1 according to the present invention, first, the layer-shaped select gate electrode formation layer 50 is formed in the memory cell region ER13 and the select gate contact regions ER16 and ER17 including the memory gate structure 4 provided with the sidewall spacers 28a and 28b on facing sidewalls thereof, and the layer-shaped logic gate electrode formation layers 51 and 52 are formed in the peripheral circuit region ER2 (electrode layer formation step).

Then, in this manufacturing method, as illustrated in FIG. 5, the logic gate electrodes RG1 and RG2 are formed on the gate insulating film 57 by patterning the logic gate electrode formation layers 51 and 52 in the peripheral circuit region ER2 (FIG. 3) by using the resists R1b and R1c patterned by a photomask. In addition, when the logic gate electrodes RG1 and RG2 are formed in this manufacturing method, the intrinsic semiconductor layer 44 in the memory gate contact regions ER11 and ER15 of the memory circuit region ER1 is removed by using the resist R1a provided in the memory circuit region ER1 to expose the cap film CP1 and partially remove the surface of the cap film CP1, thereby reducing the thickness of the cap film CP1 (logic gate electrode formation step).

Then, in this manufacturing method, as illustrated in FIG. 7, the sidewall-shaped first select gate electrode DG and the second select gate electrode SG are formed along the sidewall spacers 28a and 28b of the memory gate structure 4 by patterning the select gate electrode formation layer 50 by using the resists R2a and R2b each patterned by a photomask. In addition, the select gate electrode formation layer 50 is left in the select gate contact regions ER16 and ER17 through the resists R2a and R2b covering around part of the memory gate structure 4, to form the select gate contact formation portions 42a and 42b each provided continuously with the first select gate electrode DG or the second select gate electrode SG (select gate electrode formation step).

In this manufacturing method, during the select gate electrode formation step of forming the first select gate electrode DG, the second select gate electrode SG, and the select gate contact formation portions 42a and 42b, the cap film CP1 in the memory gate contact regions ER11 and ER15 is entirely removed to externally expose the memory gate electrode MG in the memory gate contact regions ER11 and ER15. Thus, in the semiconductor integrated circuit device 1 manufactured by such a manufacturing method, the memory gate electrode MG is externally exposed in the memory gate contact regions ER11 and ER15 to allow the memory gate contact MGC to be disposed in a standing manner on the memory gate electrode MG. With this configuration, a voltage can be applied through the memory gate electrode MG in the memory gate contact regions ER11 and ER15 to the memory gate electrode MG covered by the cap film CP1 in the memory cell region ER13.

When the memory gate electrode MG, on which the memory gate contact MGC is to be disposed in a standing manner, is externally exposed in the select gate electrode formation step, the intrinsic semiconductor layer 44a around the memory gate structure 4 is simultaneously removed in the memory gate contact regions ER11 and ER15 to physically disconnect the first select gate electrode DG and the second select gate electrode SG from each other. Thus, in this embodiment, a region in which the memory gate contact MGC is to be disposed in a standing manner on the memory gate electrode MG and a physical electrode disconnection region that physically disconnects the first select gate electrode DG and the second select gate electrode SG from each other can be simultaneously formed in the same region (memory gate contact regions ER11 and ER15) in a self-aligning manner.

When a silicide layer is formed by self-aligning in a later step, silicidation of the memory gate electrode MG can be prevented by the cap film CP1 in the memory cell region ER13 and the select gate insulating regions ER12 and ER14, and the silicide layer can be formed only on the memory gate electrode MG in the memory gate contact regions ER11 and ER15 without an additional dedicated photomask step of fabricating the memory circuit region ER1.

As described above, in this manufacturing method, fabrication to externally exposing the memory gate electrode MG being covered by the cap film CP1 in the memory circuit region ER1 can be performed simultaneously with a dedicated photomask step of fabricating the memory circuit region ER1 to form the first select gate electrode DG, the second select gate electrode SG, and the contact formation portions 42a and 42b. This eliminates the need to add any other dedicated photomask step of fabricating only the memory circuit region ER1 to externally expose the memory gate electrode MG being covered by the cap film CP1, thereby achieving reduction in manufacturing cost accordingly.

In the memory circuit region ER1 in the semiconductor integrated circuit device 1 according to the present invention, the select gate contact regions ER16 and ER17 are disposed adjacent to the memory cell region ER13, and the select gate insulating regions ER12 and ER14 and the memory gate contact regions ER11 and ER15 are disposed farther apart from the memory cell region ER13 than the select gate contact regions ER16 and ER17. In the memory circuit region ER1 having such a configuration, the memory gate structure in which the upper surface of the memory gate electrode MG is covered by the cap film CP1, the first select gate structure 5, and the second select gate structure 6 are disposed across the memory cell region ER13 and the select gate contact regions ER16 and ER17. The first select gate electrode DG and the second select gate electrode SG are electrically insulated from each other in the select gate insulating regions ER12 and ER14. The memory gate contact MGC is disposed on the memory gate electrode MG in the memory gate contact regions ER11 and ER15.

(5) Method for Manufacturing Semiconductor Integrated Circuit Device According to Other Embodiments In "(3) Method for manufacturing semiconductor integrated circuit device" described above, the select gate electrode formation step is performed after the logic gate electrode formation step. However, the present invention is not limited thereto. The select gate electrode formation step may be performed first, and thereafter, the logic gate electrode formation step may be performed. The semiconductor integrated circuit device 1 as illustrated in FIG. 2 can be manufactured in such a manufacturing method, similarly to "(3) Method for manufacturing semiconductor integrated circuit device".

In this manufacturing method, as illustrated in FIG. 3, the memory gate structure 4 including the sidewall spacers 28a and 28b (not illustrated in FIG. 3; refer to FIG. 4A) is formed across a range from the memory cell region ER13 to the memory gate contact regions ER11 and ER15. Then, the layer-shaped select gate electrode formation layer 50 in which, for example, n-type impurities are implanted is formed in the memory cell region ER13 and the select gate contact regions ER16 and ER17, and the layer-shaped intrinsic semiconductor layer 44 made of an intrinsic semiconductor is formed in the memory gate contact regions ER11 and ER15 and the select gate insulating regions ER12 and ER14. In the peripheral circuit region ER2, the layer-shaped logic gate electrode formation layer 51 in which, for example, n-type impurities are implanted is formed to cover the entire logic well RW1, and the layer-shaped logic gate electrode formation layer 52 in which p-type impurities are implanted is formed to cover the entire logic well RW2.

Figure 10:
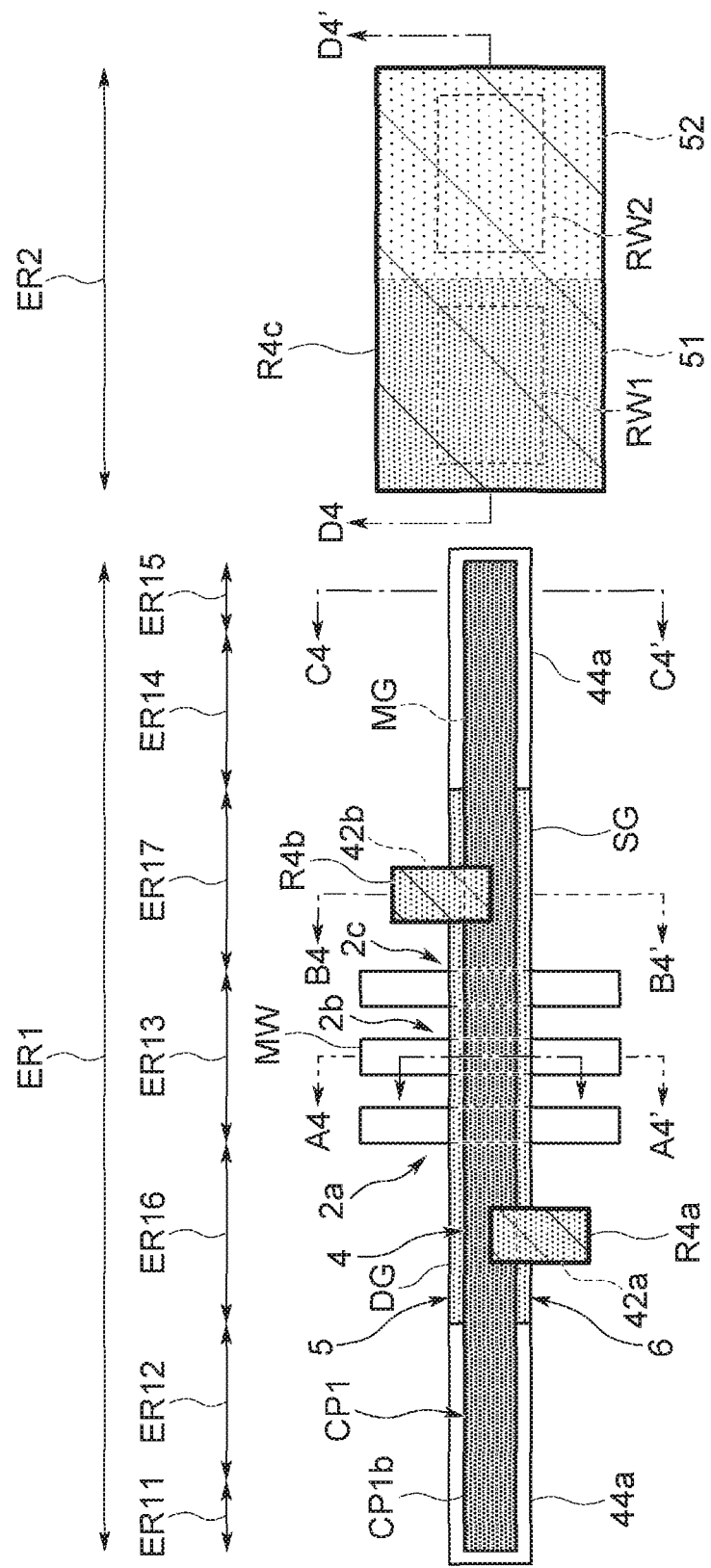
FIG. 10 is a schematic view illustrating manufacturing process (1) for a semiconductor integrated circuit device according to another embodiment.

Then, the process proceeds to the select gate electrode formation step. In the select gate electrode formation step, as illustrated in FIG. 10, in which any corresponding part in FIG. 3 is denoted by an identical reference sign, a partial region of the select gate electrode formation layer 50 around the memory gate structure 4 in the select gate contact regions ER16 and ER17 is covered by patterned resists R4a and R4b, and the entire peripheral circuit region ER2 is covered by a resist R4c. Then, the select gate electrode formation layer 50 being not covered by the resists R2a and R2b in the memory circuit region ER1 and the intrinsic semiconductor layer 44 in the select gate insulating regions ER12 and ER14 are removed by, for example, dry etching.

Accordingly, in the memory cell region ER13, the select gate electrode formation layer 50 is removed to externally expose the cap film CP1 of the memory gate structure 4 and leave the select gate electrode formation layer 50 sidewall-shaped along both sidewalls of the memory gate structure 4. As a result, the first select gate electrode DG sidewall-shaped along one of the sidewalls of the memory gate structure 4 and the second select gate electrode SG sidewall-shaped along the other sidewall of the memory gate structure 4 are disposed in the memory cell region ER13.

Simultaneously, the layer-shaped select gate electrode formation layer 50 remains intact in the regions covered by the resists R2a and R2b in the select gate contact regions ER16 and ER17 of the memory circuit region ER1 to form the select gate contact formation portion 42b provided continuously with the first select gate electrode DG and the select gate contact formation portion 42a provided continuously with the second select gate electrode SG.

Simultaneously, in the select gate insulating regions ER12 and ER14 and the memory gate contact regions ER11 and ER15, the intrinsic semiconductor layer 44 is removed to externally expose the cap film CP1 of the memory gate structure 4 and form the sidewall-shaped intrinsic semiconductor layer 44a along the sidewalls of the memory gate structure 4.

Simultaneously, in the memory circuit region ER1, the surface of the upper cap film CP1b is partially removed to reduce the thickness of the upper cap film CP1b. In this manner, in the memory circuit region ER1, the select gate electrode formation layer 50 in the memory cell region ER13 being not covered by the resists R4a and R4b is removed to form the sidewall-shaped first select gate electrode DG and the second select gate electrode SG along the sidewalls of the memory gate structure 4, and also the upper cap film CP1b in the memory circuit region ER1 is removed to form the upper cap film CP1b having the reduced thickness.

Figure 11A:
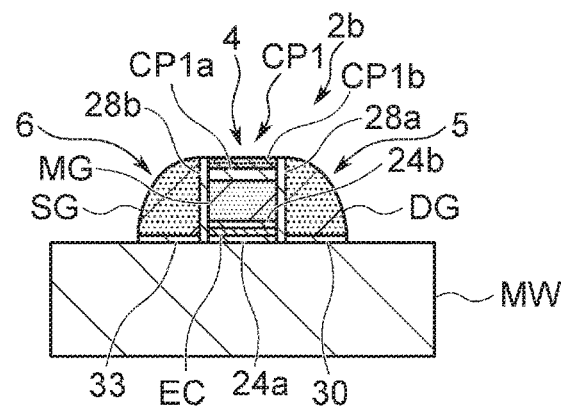
FIG. 11A is a schematic view illustrating a sectional configuration along line A4-A4' in FIG. 10.

FIG. 11A illustrates a sectional configuration along line A4-A4' in FIG. 10. As illustrated in FIG. 11A, when the first select gate electrode DG and the second select gate electrode SG are formed, the first select gate insulating film 30 and the second select gate insulating film 33 being externally exposed at the surface of the memory well MW is removed by dry etching in a region in which the memory well MW is disposed in the memory cell region ER13. As a result, the first select gate insulating film 30 and the second select gate insulating film 33 remain only on the surface of the memory well MW covered by the sidewall-shaped first select gate electrode DG and the second select gate electrode SG.

Accordingly, the memory cell 2b is formed in such a configuration that, in the region in which the memory well MW is disposed in the memory cell region ER13, the cap film CP1 is formed on the memory gate electrode MG, and the sidewall-shaped first select gate structure 5 and the sidewall-shaped second select gate structure 6 are disposed facing to each other on the sidewalls of the memory gate structure 4 through the sidewall spacers 28a and 28b.

Figure 11B:
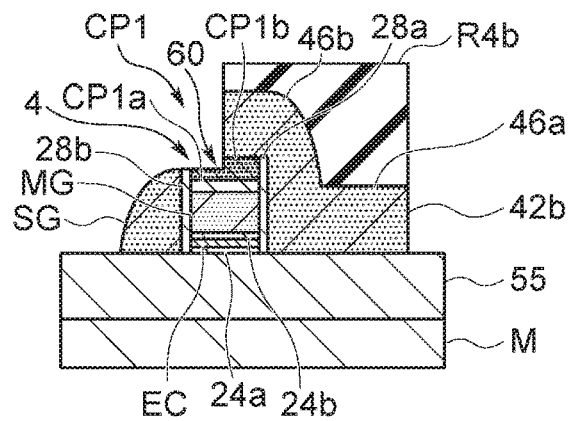
FIG. 11B is a schematic view illustrating a sectional configuration along line B4-B4' in FIG. 10.

Simultaneously, as illustrated in FIG. 11B, which illustrates a sectional configuration along line B4-B4' in FIG. 10, the select gate electrode formation layer 50 being covered by the resist R4b remains intact to form the select gate contact formation portion 42b in the select gate contact region ER17 in which the resist R4b is disposed. The select gate contact formation portion 42b includes the flat portion 46a disposed on the element isolation layer 55 and having a flat surface in accordance with the shape of the substrate surface of the element isolation layer 55, and the mounting portion 46b integrally formed with the flat portion 46a and mounting on part of the cap film CP1 of the memory gate structure 4.

Figure 11C:
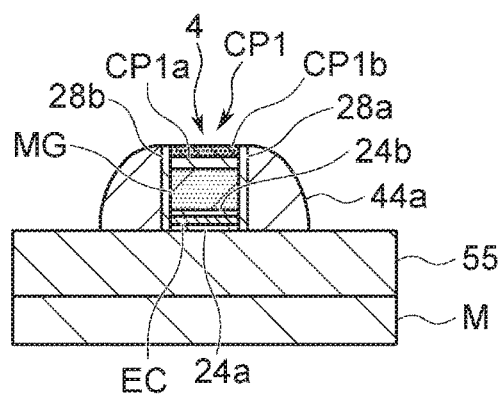
FIG. 11C is a schematic view illustrating a sectional configuration along line C4-C4' in FIG. 10.
Figure 11D:
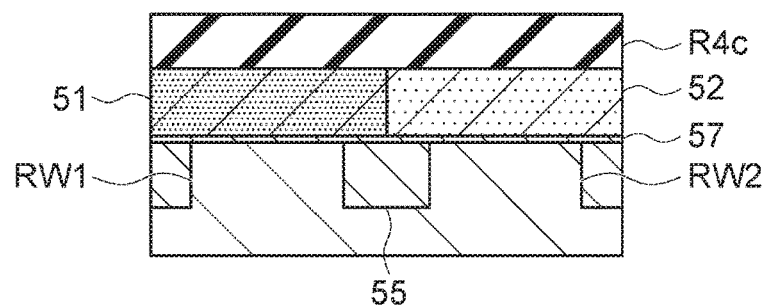
FIG. 11D is a schematic view illustrating a sectional configuration along line D4-D4' in FIG. 10.

As illustrated in FIG. 11C, which illustrates a sectional configuration along line C4-C4' in FIG. 10, in the memory gate contact region ER15, the cap film CP1 is provided on the memory gate electrode MG, and the sidewall-shaped intrinsic semiconductor layer 44a are disposed facing to each other on the sidewalls of the memory gate structure 4 through the sidewall spacers 28a and 28b. Since the peripheral circuit region ER2 is entirely covered by the resist R4c as illustrated in FIG. 11D, which illustrates a sectional configuration along line D4-D4' in FIG. 10, the layer-shaped logic gate electrode formation layers 51 and 52 remains intact in the peripheral circuit region ER2.

Figure 12:
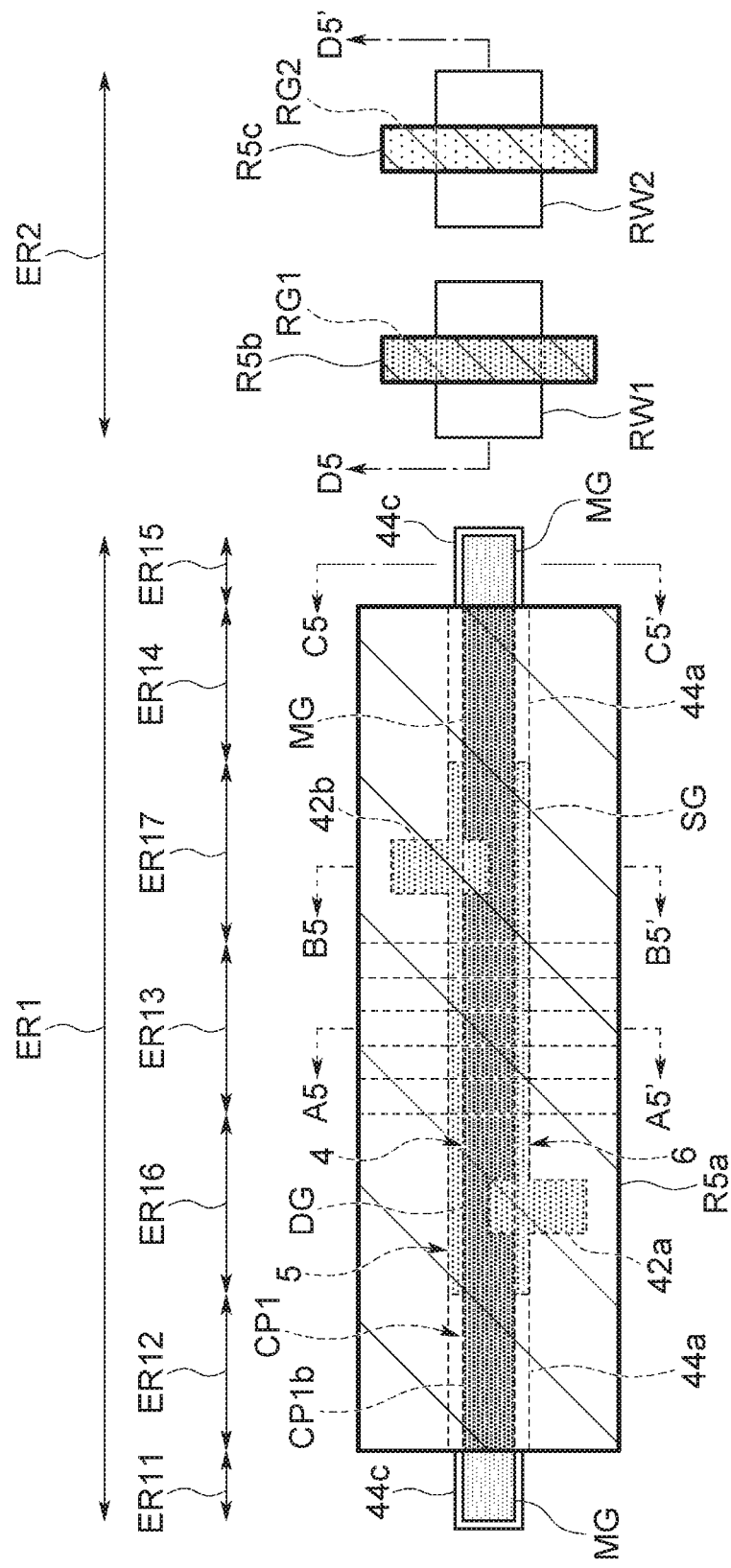
FIG. 12 is a schematic view illustrating manufacturing process (2) for a semiconductor integrated circuit device according to the other embodiment.

After the resists R4a, R4b, and R4c are removed, the process proceeds to the subsequent logic gate electrode formation step. As illustrated in FIG. 12, in which any corresponding part to that in FIG. 10 is denoted by an identical reference sign, in the logic gate electrode formation step, the memory cell region ER13, the select gate contact regions ER16 and ER17, and the select gate insulating regions ER12 and ER14 of the memory circuit region ER1 are covered by a patterned resist R5a, and the logic gate electrode formation layers 51 and 52 in the peripheral circuit region ER2 are covered by resists R5b and R5c patterned according to the outline shapes of the logic gate electrodes RG1 and RG2 (FIG. 2) to be formed last.

Then, the upper cap film CP1b in the memory gate contact regions ER11 and ER15 being exposed out of the resist R5a in the memory circuit region ER1 is removed by dry etching, and the logic gate electrode formation layers 51 and 52 being exposed out of the resists R1b and R1c in the peripheral circuit region ER2 are removed by dry etching.

Accordingly, in the peripheral circuit region ER2, the logic gate electrode formation layers 51 and 52 being not covered by the resists R5b and R5c are removed, whereas the logic gate electrode formation layers 51 and 52 remain in regions being covered by the resists R5b and R5c, to form the logic gate electrodes RG1 and RG2.

Simultaneously, in the memory gate contact regions ER11 and ER15, the upper cap film CP1b being externally exposed is removed to expose the lower cap film CP1a on the memory gate electrode MG, and also the sidewall-shaped intrinsic semiconductor layer 44a being externally exposed is removed. As a result, a sidewall-shaped intrinsic semiconductor layer 44c slightly remains around the sidewall of the memory gate electrode MG.

Since part of the surface of the upper cap film CP1b in the memory gate contact regions ER11 and ER15 is removed by dry etching in advance in the select gate electrode formation step illustrated in FIG. 10 and hence has a reduced thickness, the amount of etching to remove the upper cap film CP1b can be reduced to prevent over-etching of the peripheral circuit region ER2 accordingly. Due to the reduced amount of etching to remove the upper cap film CP1b, the sidewall-shaped intrinsic semiconductor layer 44c slightly remains along the sidewall of the memory gate electrode MG in the memory gate contact regions ER11 and ER15 when the removal of the upper cap film CP1b is ended.

Then, the lower cap film CP1a exposed in the memory gate contact regions ER11 and ER15 is removed by dry etching with different etching gas (for example, dry etching with fluorine gas) to expose the memory gate electrode MG in the memory gate contact regions ER11 and ER15 as illustrated in FIG. 12.

In this embodiment, too, the cap film CP1 has a stacked structure including the lower cap film CP1a and the upper cap film CP1b, and the upper cap film CP1b is made of SiN. Thus, it is possible to only remove the upper cap film CP1b by utilizing selectivity between SiN and $SiO_2$ at dry etching while suppressing removal of the element isolation layer 55. Accordingly, this embodiment can suppress generation of a step between the substrate surface of, for example, a memory well made of Si and the element isolation layer 55 when the cap film CP1 is removed, thereby reducing influence on element characteristics due to the step of removing the cap film CP1.

Figure 13A:
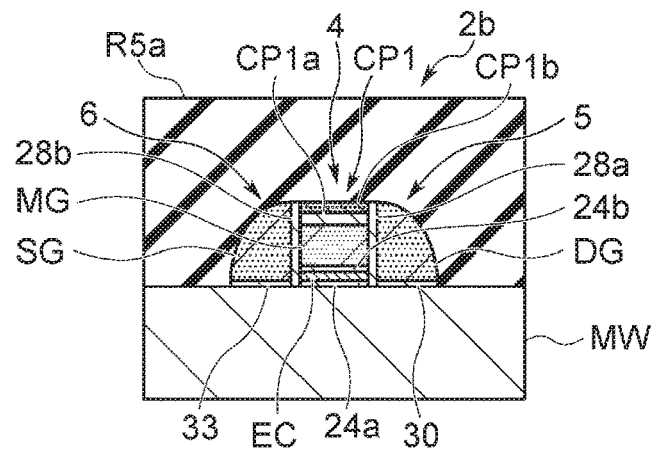
FIG. 13A is a schematic view illustrating a sectional configuration along line A5-A5' in FIG. 12.
Figure 13B:
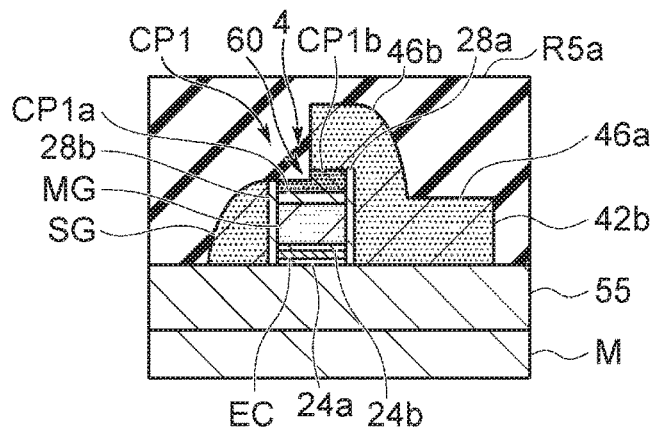
FIG. 13B is a schematic view illustrating a sectional configuration along line B5-B5' in FIG. 12.

FIG. 13A illustrates a sectional configuration along line A5-A5' in FIG. 12. As illustrated in FIG. 13A, in the memory cell region ER13, the memory cell 2b is formed in such a configuration that the sidewall-shaped first select gate structure 5 and the sidewall-shaped second select gate structure 6 are disposed facing to each other on the sidewalls of the memory gate structure 4 through the sidewall spacers 28a and 28b. The memory cell 2b is covered by the resist R5a. As illustrated in FIG. 13B, which illustrates a sectional configuration along line B5-B5' in FIG. 12, the resist R5a also covers the select gate contact region ER17 in which the select gate contact formation portion 42b is disposed.

Figure 13C:
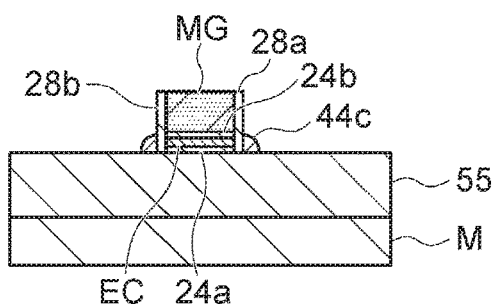
FIG. 13C is a schematic view illustrating a sectional configuration along line C5-C5' in FIG. 12.

As illustrated in FIG. 13C, which illustrates a sectional configuration along line C5-C5' in FIG. 12, the upper cap film CP1b being not covered by the resist R5a is removed in the memory gate contact region ER15, and then the lower cap film CP1a is removed by dry etching with different etching gas to externally expose the memory gate electrode MG. Simultaneously, the sidewall-shaped intrinsic semiconductor layer 44a remaining along the sidewall spacers 28a and 28b on the sidewall of the memory gate electrode MG is removed in the memory gate contact region ER15, but the sidewall-shaped intrinsic semiconductor layer 44a slightly remains along the sidewall spacers 28a and 28b due to an etching condition on the logic gate electrodes RG1 and RG2 simultaneously formed in the peripheral circuit region ER2. It is possible, however, to completely remove the intrinsic semiconductor layer (semiconductor layer) 44c in the memory gate contact region ER15 depending on the etching condition on the logic gate electrodes RG1 and RG2. In such a case, when the intrinsic semiconductor layer 44c provided continuously with the first select gate electrode DG and the second select gate electrode SG is removed, the memory gate contact regions ER11 and ER15 serve as physical electrode disconnection regions that each divide the first select gate electrode DG and the second select gate electrode SG from each other.

Figure 13D:
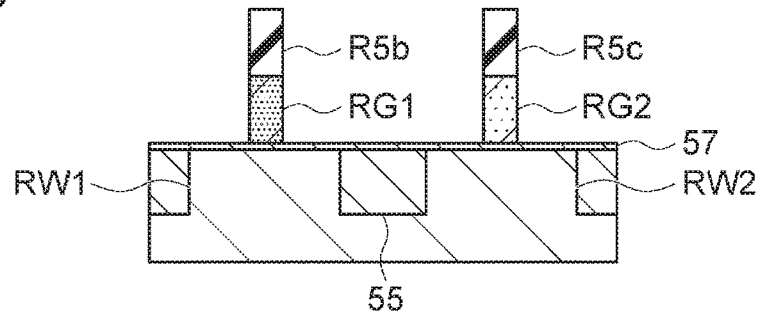
FIG. 13D is a schematic view illustrating a sectional configuration along line D5-D5' in FIG. 12.

As illustrated in FIG. 13D, which illustrates a sectional configuration along line D5-D5' in FIG. 12, the logic gate electrode formation layers 51 and 52 remain to form the logic gate electrodes RG1 and RG2 in partial regions of the logic wells RW1 and RW2 being covered by the resists R5b and R5c in the peripheral circuit region ER2. Accordingly, in the peripheral circuit region ER2, the logic gate electrode RG1 is disposed on the logic well RW1 through the gate insulating film 57, and the logic gate electrode RG2 is disposed on the logic well RW2 through the gate insulating film 57.

In this manner, in the logic gate electrode formation step, the logic gate electrodes RG1 and RG2 are formed by patterning the logic gate electrode formation layers 51 and 52 in the peripheral circuit region ER2 by using the resists R5b and R5c, and simultaneously, the upper cap film CP1b in the memory gate contact regions ER11 and ER15 is removed to externally expose the lower cap film CP1a, and the lower cap film CP1a is removed to expose the memory gate electrode MG in the memory gate contact regions ER11 and ER15.

Subsequently, the resists R2a, R2b, and R2c are removed, and then the process proceeds to the impurity implantation step similarly to "(3) Method for manufacturing semiconductor integrated circuit device". The i-type intrinsic semiconductor layer 44b, the p-type opposite-conductivity-type semiconductor layer 43, and the i-type intrinsic semiconductor layer 44b are disposed in this order in the select gate insulating region ER12 (ER14) between the memory cell region ER13 and the memory gate contact region ER11 (ER15). Accordingly, a pin junction diode is formed as a junction of the intrinsic semiconductor layer 44b and the n-type first select gate electrode DG and the n-type second select gate electrode SG in the memory cell region ER13. Simultaneously, p-type impurities, the conductivity type of which is same as that of impurities implanted into the memory circuit region ER1, are implanted into the peripheral circuit region ER2 to form the p-type source-drain regions RSD3 and RSD4 in the logic well RW2.

Then, after any resist used in the impurity implantation step is removed, the gate insulating film 57 being externally exposed on the logic wells RW1 and RW2 in the peripheral circuit region ER2 is removed to leave the gate insulating film 57 intact directly below the logic gate electrodes RG1 and RG2. In this manner, the logic gate electrodes RG1 and RG2, and the logic gate structures 7a and 7b made of the patterned gate insulating film 57 are formed. Thereafter, the semiconductor integrated circuit device 1 is manufactured by sequentially performing, for example, the step of forming the n-type source-drain regions RSD1 and RSD2, the step of forming the silicide layers 51, S2, and S and the like on the first select gate electrode DG and the second select gate electrode SG, and the step of forming the interphase insulation layer, the first select gate contact DGC, the second select gate contact SGC, the memory gate contact MGC, the contacts RGC1, RG2, RC1, RC2, RC3, and RC4, and the like.

With the above-described configuration, in the manufacturing method according to another embodiment, the select gate electrode formation layer 50 in the memory cell region ER13 is etched back while the peripheral circuit region ER2 is covered by the resist R4c patterned by a photomask. In this manner, the sidewall-shaped first select gate electrode DG is formed along the first sidewall spacer 28a, the sidewall-shaped second select gate electrode SG electrically insulated from the first select gate electrode DG is formed along the second sidewall spacer 28b, and the surface of the cap film CP1 in the memory circuit region ER1 is partially removed to reduce the thickness of the cap film CP1 (select gate electrode formation step).

Then, in this manufacturing method, the cap film CP1 in the memory gate contact regions ER11 and ER15 is removed while the memory cell region ER13, the select gate contact regions ER16 and ER17, and the select gate insulating regions ER12 and ER14 are covered by the resist R5a patterned by a photomask, and then the logic gate electrode formation layers 51 and 52 in the peripheral circuit region ER2 are patterned by using the resists R5b and R5c to form the logic gate electrodes RG1 and RG2 (logic gate electrode formation step).

In this manufacturing method, during the logic gate electrode formation step of forming the logic gate electrodes RG1 and RG2, the cap film CP1 in the memory gate contact regions ER11 and ER15 is entirely removed to externally expose the memory gate electrode MG in the memory gate contact regions ER11 and ER15. Thus, in the semiconductor integrated circuit device 1 manufactured by such a manufacturing method, the memory gate electrode MG is externally exposed in the memory gate contact regions ER11 and ER15 to allow the memory gate contact MGC to be disposed in a standing manner on the memory gate electrode MG. With this configuration, a voltage can be applied through the memory gate electrode MG in the memory gate contact regions ER11 and ER15 to the memory gate electrode MG covered by the cap film CP1 in the memory cell region ER13.

This manufacturing method can manufacture the memory cell 2b in which the first select gate electrode DG and the second select gate electrode SG are sidewall-shaped along the sidewalls of the memory gate structure 4, and the cap film CP1 having a predetermined thickness is provided on the memory gate electrode MG.

Then, in such a manufacturing method, fabrication to externally expose the memory gate electrode MG covered by the cap film CP1 in the memory circuit region ER1 can be performed simultaneously with a dedicated photomask step of fabricating the peripheral circuit region ER2 to form the logic gate electrodes RG1 and RG2. This eliminates the need to add a dedicated photomask step of only fabricating the memory circuit region ER1 to externally expose the memory gate electrode MG covered by the cap film CP1, thereby achieving reduction in manufacturing cost accordingly.

(6) Other Embodiments

Figure 14:
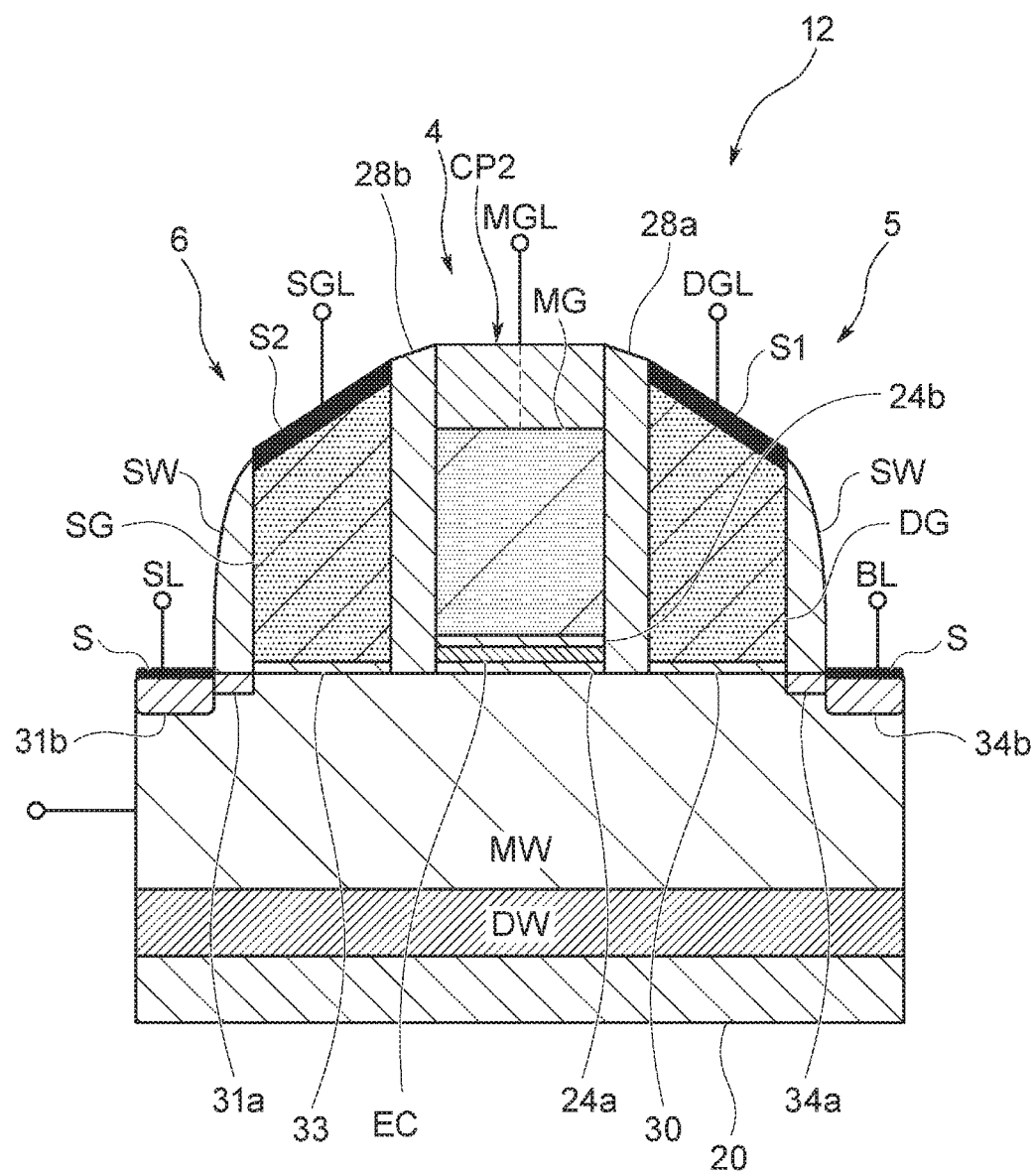
FIG. 14 is a schematic view illustrating a sectional configuration of a memory cell according to the other embodiment.

The present invention is not limited to the present embodiment, various modifications are possible within the scope of the present invention. For example, various voltage values may be applied at each site. Although the above-described embodiment describes the cap film CP1 having a stacked structure including the lower cap film CP1a and the upper cap film CP1b, the present invention is not limited thereto. The cap film may include three, four, or any other number of stacked layers. As illustrated in FIG. 14, in which any corresponding part in FIG. 1 is denoted by an identical reference sign, such a memory cell 12 is applicable in which a single-layer cap film CP2 is disposed on the memory gate electrode MG. The memory cell 12 illustrated in FIG. 14 has "(2) Planar layout of semiconductor integrated circuit device" described above and can be manufactured by "(3)

Method for manufacturing semiconductor integrated circuit device" or "(5) Method for manufacturing semiconductor integrated circuit device according to other embodiments" described above.

Figure 15:
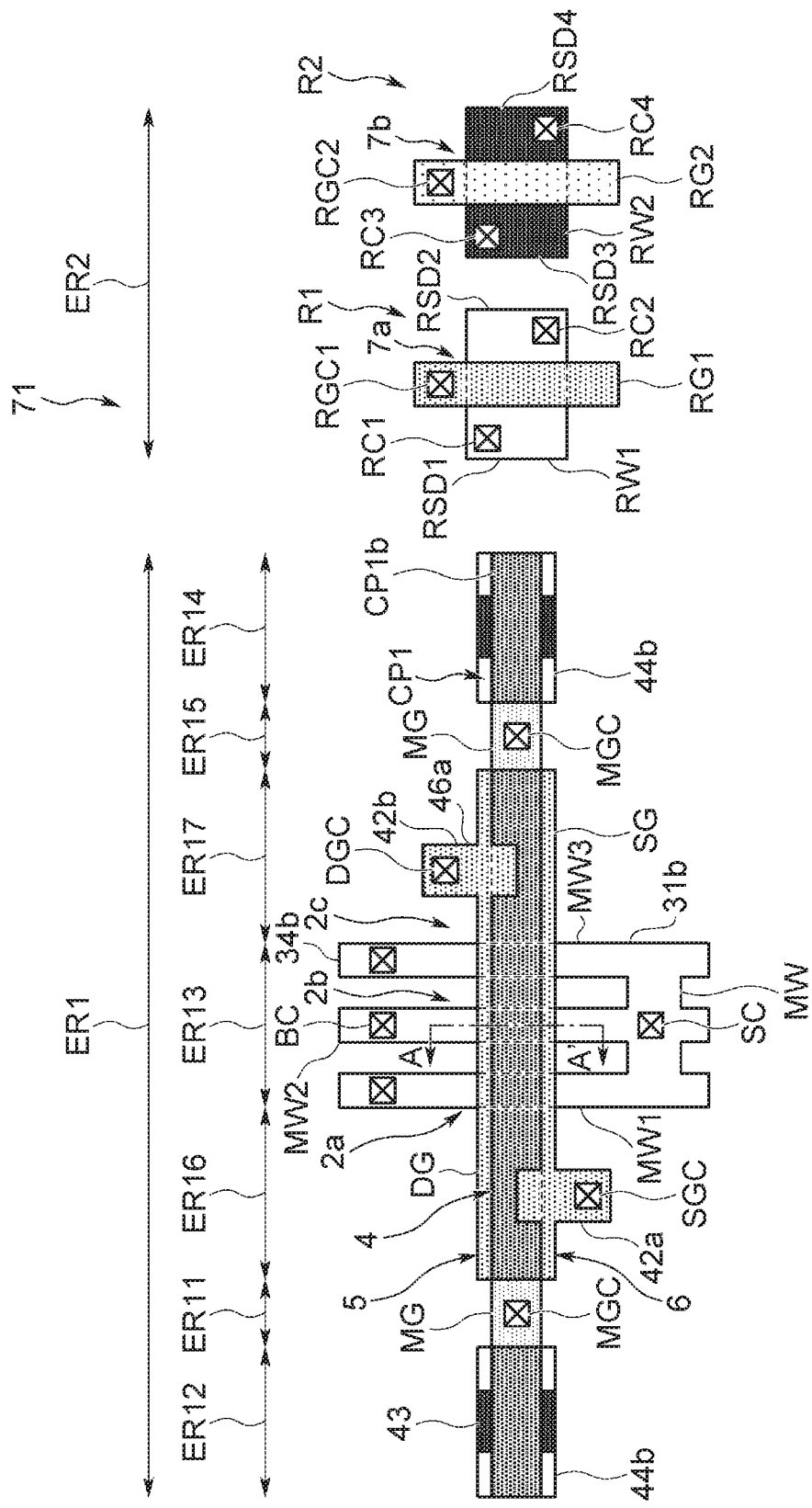
FIG. 15 is a schematic view illustrating a planar layout of a semiconductor integrated circuit device according to the other embodiment.

The above-described embodiment describes the semiconductor integrated circuit device 1 in which the first select gate insulating region ER12 is disposed at an end of the first select gate contact region ER16 and the second select gate insulating region ER14 is disposed at an end of the second select gate contact region ER17 as illustrated in FIG. 2. However, the present invention is not limited thereto. As illustrated in FIG. 15, in which any corresponding part in FIG. 2 is denoted by an identical reference sign, a semiconductor integrated circuit device 71 is applicable in which the first memory gate contact region ER11 is disposed at the end of the first select gate contact region ER16 and the second memory gate contact region ER15 is disposed at the end of the second select gate contact region ER17.

In the memory circuit region ER1 of the semiconductor integrated circuit device 71, the first memory gate contact region ER11 is disposed between the select gate contact region ER16 and the first select gate insulating region ER12, and the second memory gate contact region ER15 is disposed between the select gate contact region ER16 and the second select gate insulating region ER14. Accordingly, the memory circuit region ER1 includes the first select gate insulating region ER12, the first memory gate contact region ER11, the first select gate contact region ER16, the memory cell region ER13, the second select gate contact region ER17, the second memory gate contact region ER15, and the second select gate insulating region ER14 disposed in this order. With this configuration, the semiconductor integrated circuit device 71 can be manufactured by a manufacturing method similarly to that for the semiconductor integrated circuit device 1 described above, and achieve an effect similarly to that of the semiconductor integrated circuit device 1 described above.

According to another embodiment, for example, the first memory gate contact region ER11 may be disposed next to the first select gate contact region ER16 through the first select gate insulating region ER12, and the second select gate insulating region ER14 may be disposed next to the second select gate contact region ER17 through the second memory gate contact region ER15. Alternatively, the select gate insulating regions ER12 and ER14 may be disposed only on one side of the memory cell regions. In such a case, the memory circuit region ER1 includes, for example, the first memory gate contact region ER11, the first select gate insulating region ER12, the first select gate contact region ER16, the memory cell region ER13, the second select gate contact region ER17, and the second memory gate contact region ER15 disposed in this order.

In the above-described embodiment, the select gate contact formation portion 42a is provided in the first select gate contact region ER16, and the select gate contact formation portion 42b is provided in the second select gate contact region ER17. However, the present invention is not limited thereto. For example, the select gate contact formation portions 42a and 42b may be both provided only in the select gate contact region ER16 as one of the select gate contact regions ER16 and ER17. According to another embodiment, the select gate contact formation portions 42a and 42b may be both provided in the first select gate contact region ER16, and additionally, the select gate contact formation portions 42a and 42b may be both provided in the second select gate contact region ER17.

In the above-described embodiment, the opposite-conductivity-type semiconductor layer 43 is disposed in the select gate insulating regions ER12 and ER14 to form a pin junction diode of the first select gate electrode DG and the second select gate electrode SG, the intrinsic semiconductor layer 44b, and the opposite-conductivity-type semiconductor layer 43. However, the present invention is not limited thereto. Only the intrinsic semiconductor layer 44b may be provided in the select gate insulating regions ER12 and ER14. When the select gate insulating regions ER12 and ER14 only include the intrinsic semiconductor layer 44b, the first select gate electrode DG and the second select gate electrode SG cannot be electrically insulated by the select gate insulating regions ER12 and ER14. Thus, the first select gate electrode DG and the second select gate electrode SG need to be physically disconnected from each other by removing the intrinsic semiconductor layer around the memory gate electrode MG in the memory gate contact regions ER11 and ER15.

In the above-described embodiment, the P-type memory well MW may be employed together with the memory gate structure 4 included in an N-type transistor structure, the first select gate structure 5 included in an N-type MOS transistor structure, and the second select gate structure 6 included in an N-type MOS transistor structure. However, the present invention is not limited thereto. An N-type memory well may be employed together with a memory gate structure included in a P-type transistor structure, a first select gate structure included in a P-type MOS transistor structure, and a second select gate structure included in a P-type MOS transistor structure.

In this case, the conductivity types of N type and P type are inverted in the memory cell 2b described in the above-described embodiment, and thus voltages applied to the memory gate structure, the first select gate structure, the second select gate structure, the bit line, and the source line change accordingly. In this case, too, similarly to the above-described embodiment, voltages applied to the bit line and the source line can be reduced irrespective of the charge storage gate voltage applied to the memory gate electrode. The reduction can be made to voltage values necessary for the memory well to become a non-conductive state below regions of the first select gate structure and the second select gate structure. This reduction of the voltage values of the bit line and the source line allows reduction in the thickness of the first select gate insulating film of the first select gate structure and the thickness of the second select gate insulating film of the second select gate structure, thereby achieving faster operation and reduction in the area of any peripheral circuit.

In the above-described embodiment, data is programmed by injecting charge into the charge storage layer EC of the memory cell 2b, and data is erased by removing charge in the charge storage layer EC. However, the present invention is not limited thereto. An opposite configuration may be applied that data is programmed by removing charge in the charge storage layer EC of the memory cell 2b, and data is erased by injecting charge in the charge storage layer EC.

In the above-described embodiment, the i-type intrinsic semiconductor layer 44b and the p-type opposite-conductivity-type semiconductor layer 43 are disposed in the select gate insulating regions ER12 and ER14 to form a pin junction with the first select gate electrode DG and the second select gate electrode SG in the memory cell region ER13, thereby electrically insulating the first select gate electrode DG and the second select gate electrode SG across the select gate insulating regions ER12 and ER14. However, the present invention is not limited thereto. A p-type opposite-conductivity-type semiconductor layer may be disposed in the select gate insulating regions ER12 and ER14 to form a pn junction with the first select gate electrode DG and the second select gate electrode SG in the memory cell region ER13, thereby electrically insulating the first select gate electrode DG and the second select gate electrode SG across the select gate insulating regions ER12 and ER14.

REFERENCE SIGNS LIST 1 semiconductor integrated circuit device
2a, 2b, 2c, 12 memory cell
4 memory gate structure
5 first select gate structure
6 second select gate structure
30 first select gate insulating film
34b drain region
33 second select gate insulating film
31b source region
BL bit line
SL source line
MW memory well
MG memory gate electrode
DG first select gate electrode
SG second select gate electrode
EC charge storage layer
CP1, CP2 cap film
CP1a lower cap film
CP1b upper cap film

What is claimed is:

1. A semiconductor integrated circuit device including a memory circuit region and a peripheral circuit region, the memory circuit region including a memory cell region and a memory gate contact region, the memory cell region including a plurality of memory cells disposed in a matrix of rows and columns, at least one bit line and at least one source line being connected to the memory cells, the memory cell comprising:
   a drain region disposed on a surface of a memory well and connected with the bit line;
   a source region disposed on the surface of the memory well and connected with the source line;
   a memory gate structure disposed between the drain region and the source region and including an lower memory gate insulating film, a charge storage layer, an upper memory gate insulating film, a memory gate electrode, and a cap film made of an insulating material stacked in this order over the memory well;
   a first select gate structure including a first select gate electrode and a first select gate insulating film, the first select gate electrode being disposed through the first select gate insulating film over the memory well between the drain region and the memory gate structure, the first select gate structure being adjacent to a first sidewall of the memory gate structure through a first sidewall spacer; and
   a second select gate structure including a second select gate electrode and a second select gate insulating film, the second select gate electrode being disposed through the second select gate insulating film over the memory well between the source region and the memory gate structure, the second select gate structure being adjacent to a second sidewall of the memory gate structure through a second sidewall spacer, wherein
   the first select gate electrode has a sidewall shape and disposed with respect to the first sidewall spacer, and is provided with a silicide layer on an upper surface portion of the first select gate electrode, and
   the second select gate electrode has a sidewall shape and disposed with respect to the second sidewall spacer, and is provided with a silicide layer on an upper surface portion of the second select gate electrode, and
   the memory gate electrode disposed in the memory cell region extends into the memory gate contact region but neither of the first select gate electrode and the second select gate electrode extend into the memory gate contact region, and
   in the memory gate contact region, the cap film is not provided to the memory gate electrode but a memory gate contact is disposed in a standing manner on the memory gate electrode.

2. The semiconductor integrated circuit device according to claim 1, wherein the cap film of the memory cell has a stacked structure including
   a lower cap film formed on the memory gate electrode, and
   an upper cap film formed on the lower cap film and made of an insulating material different from a material of the lower cap film.

3. The semiconductor integrated circuit device according to claim 1, wherein the memory circuit region includes a select gate insulating region disposed between the memory cell region and the memory gate contact region, and
   the memory gate electrode disposed in the memory cell region extends into the select gate insulating region, and an opposite-conductivity-type semiconductor layer of a conductivity type different from a conductivity type of the first and the second select gate electrodes is disposed on the sidewall of the memory gate electrode.

4. The semiconductor integrated circuit device according to claim 1, wherein
   the memory circuit region includes a select gate insulating region and the memory gate contact region, the memory gate contact region being disposed between the memory cell region and the select gate insulating region, and
   the memory gate electrode disposed in the memory cell region extends into the select gate insulating region, and an opposite-conductivity-type semiconductor layer of a conductivity type different from a conductivity type of the first and the second select gate electrodes is disposed on the sidewall of the memory gate electrode.

5. The semiconductor integrated circuit device according to claim 1, wherein
   the memory circuit region includes a select gate contact region including at least one of a select gate contact formation portion provided continuously with the first select gate electrode and another select gate contact formation portion provided continuously with the second select gate electrode, and
   the select gate contact region is disposed between the memory cell region and the memory gate contact region.

6. A method for manufacturing a semiconductor integrated circuit device including
   a memory circuit region in which a memory cell including a first select gate structure, a second select gate structure, and a memory gate structure is disposed, the first select gate structure including a silicide layer on a first select gate electrode, the second select gate structure including a silicide layer on a second select gate electrode, the memory gate structure being disposed between the first select gate structure and the second select gate structure through a sidewall spacer, and a peripheral circuit region in which a logic gate structure of a peripheral circuit is disposed, the method comprising:

an electrode layer formation step of providing the memory gate structure including a lower gate insulating film, a charge storage layer, an upper gate insulating film, a memory gate electrode, and a cap film made of an insulating material stacked in this order on a memory well, across the memory circuit region from a memory cell region to a memory gate contact region, forming the sidewall spacer on each of facing sidewalls of the memory gate structure, and then forming a layer-shaped select gate electrode formation layer in the memory cell region and a layer-shaped logic gate electrode formation layer in the peripheral circuit region;

a logic gate electrode formation step of reducing a thickness of the cap film in the memory gate contact region to be smaller than a thickness of the cap film in the memory cell region by partially removing a surface of the cap film of the memory gate structure disposed in the memory gate contact region while covering the select gate electrode formation layer in the memory cell region by using a resist patterned by using a photomask, and forming a logic gate electrode of the logic gate structure by patterning the logic gate electrode formation layer in the peripheral circuit region by using the resist; and a select gate electrode formation step of forming the first select gate electrode having a sidewall-shape along one of the sidewall spacers and the second select gate electrode electrically insulated from the first select gate electrode and having a sidewall-shape along the other sidewall spacer by etching back the select gate electrode formation layer in the memory cell region while covering the peripheral circuit region by using a resist patterned by using a photomask, and removing the cap film in each of the memory cell region and the memory gate contact region, in a state that the thickness of the cap film in the memory gate contact region is smaller than the thickness of the cap film in the memory cell region, wherein, in the select gate electrode formation step, the cap film remains in the memory cell region, and the cap film in the memory gate contact region is removed to expose the memory gate electrode in the memory gate contact region.

7. The method for manufacturing a semiconductor integrated circuit device according to claim 6, further comprising, before the electrode layer formation step, a cap film formation step of forming, on the memory gate electrode, a lower cap film made of an insulating material, and forming, on the lower cap film, an upper cap film made of an insulating material different from a material of the lower cap film, to form the cap film as a stack of the lower cap film and the upper cap film on the memory gate electrode, wherein in the logic gate electrode formation step, a surface of the upper cap film in the memory gate contact region is partially removed to reduce a thickness of the upper cap film to be smaller than a thickness of the upper cap film in the memory cell region, and in the select gate electrode formation step, the upper cap film in the memory gate contact region is entirely removed while the upper cap film is remained in the memory cell region, and then the lower cap film exposed in the memory gate contact region is removed to expose the memory gate electrode in the memory gate contact region.

8. The method for manufacturing a semiconductor integrated circuit device according to claim 6, wherein, in the select gate electrode formation step, a semiconductor layer disposed around the memory gate electrode and provided continuously with the first select gate electrode and the second select gate electrode is removed, and a region in which the memory gate contact is to be disposed in a standing manner on the memory gate electrode, and a physical electrode disconnection region that divides the first select gate electrode and the second select gate electrode from each other are formed in a self-aligning manner in the same memory gate contact region.

9. The method for manufacturing a semiconductor integrated circuit device according to claim 6, wherein, in the select gate electrode formation step, by using the resist, the select gate electrode formation layer partially remains to form a select gate contact formation portion provided continuously with the first select gate electrode and including a flat portion and to form another select gate contact formation portion provided continuously with the second select gate electrode and including a flat portion.

10. A method for manufacturing a semiconductor integrated circuit device including a memory circuit region in which a memory cell including a first select gate structure, a second select gate structure, and a memory gate structure is disposed, the first select gate structure including a silicide layer on a first select gate electrode, the second select gate structure including a silicide layer on a second select gate electrode, the memory gate structure being disposed between the first select gate structure and the second select gate structure through a sidewall spacer, and a peripheral circuit region in which a logic gate structure of a peripheral circuit is disposed, the method comprising:

an electrode layer formation step of providing the memory gate structure including a lower gate insulating film, a charge storage layer, an upper gate insulating film, a memory gate electrode, and a cap film made of an insulating material stacked in this order on a memory well, across the memory circuit region from a memory cell region to a memory gate contact region, forming the sidewall spacer on each of facing sidewalls of the memory gate structure, and then, forming a layer-shaped select gate electrode formation layer in the memory cell region and a layer-shaped logic gate electrode formation layer in the peripheral circuit region;

a select gate electrode formation step of forming the first select gate electrode having a sidewall-shape along one of the sidewall spacers and the second select gate electrode electrically insulated from the first select gate electrode and having a sidewall-shape along the other sidewall spacer by etching back the select gate electrode formation layer in the memory cell region while covering the peripheral circuit region by using a resist patterned by using a photomask, and reducing a thickness of the cap film by partially removing a surface of the cap film in the memory circuit region; and a logic gate electrode formation step of forming a logic gate electrode of the logic gate structure by removing the cap film in the memory gate contact region while covering the memory cell region by using a resist patterned by using a photomask and by patterning the logic gate electrode formation layer in the peripheral circuit region by using the resist, wherein, in the logic gate electrode formation step, the cap film in the memory gate contact region is removed to expose the memory gate electrode in the memory gate contact region while the cap film is remained in the memory cell region.

11. The method for manufacturing a semiconductor integrated circuit device according to claim 10, further comprising, before the electrode layer formation step, a cap film formation step of forming, on the memory gate electrode, a lower cap film made of an insulating material, and forming, on the lower cap film, an upper cap film made of an insulating material different from a material of the lower cap film, to form the cap film as a stack of the lower cap film and the upper cap film on the memory gate electrode, wherein in the select gate electrode formation step, a surface of the upper cap film in each of the memory cell region and the memory gate contact region is partially removed to reduce a thickness of the upper cap film, and in the logic gate electrode formation step, the upper cap film in the memory gate contact region is entirely removed while the upper cap film is remained in the memory cell region, and then the lower cap film exposed in the memory gate contact region is removed to expose the memory gate electrode in the memory gate contact region.

12. The method for manufacturing a semiconductor integrated circuit device according to claim 10, wherein, in the logic gate electrode formation step, a semiconductor layer disposed around the memory gate electrode and provided continuously with the first and the second select gate electrodes is removed, and a region in which the memory gate contact is to be disposed in a standing manner on the memory gate electrode, and a physical electrode disconnection region that divides the first select gate electrode and the second select gate electrode from each other are formed in a self-aligning manner in the same memory gate contact region.

* * * * *